(12) United States Patent
Wu et al.

(10) Patent No.: US 12,317,589 B2
(45) Date of Patent: May 27, 2025

(54) POWER RAIL AND SIGNAL CONDUCTING LINE ARRANGEMENT

(71) Applicant: TAIWAN SEMICONDUCTOR MANUFACTURING COMPANY, LTD., Hsinchu (TW)

(72) Inventors: Guo-Huei Wu, Hsinchu (TW); Shih-Wei Peng, Hsinchu (TW); Wei-Cheng Lin, Hsinchu (TW); Hui-Zhong Zhuang, Hsinchu (TW); Chih-Liang Chen, Hsinchu (TW); Li-Chun Tien, Hsinchu (TW); Lee-Chung Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/641,719

(22) Filed: Apr. 22, 2024

(65) Prior Publication Data

US 2024/0274607 A1    Aug. 15, 2024

Related U.S. Application Data

(62) Division of application No. 17/395,126, filed on Aug. 5, 2021, now Pat. No. 11,967,596.

(51) Int. Cl.
*H10D 84/90* (2025.01)
*G06F 30/31* (2020.01)
(Continued)

(52) U.S. Cl.
CPC ........... *H10D 84/907* (2025.01); *G06F 30/31* (2020.01); *G06F 30/392* (2020.01);
(Continued)

(58) Field of Classification Search
CPC ............ H10D 84/907; H10D 84/0186; H10D 84/038; H10D 89/10; H10D 84/912;
(Continued)

(56) References Cited

U.S. PATENT DOCUMENTS

| 7,260,442 B2 | 8/2007 | Hwang et al. | |
|---|---|---|---|
| 8,863,063 B2 * | 10/2014 | Becker | G06F 30/392 716/118 |

(Continued)

*Primary Examiner* — Yasser A Abdelaziz
(74) *Attorney, Agent, or Firm* — Hauptman Ham, LLP

(57) ABSTRACT

A method includes fabricating a first-voltage underlayer power rail conductively connecting to the source region of a first-type transistor and fabricating a second-voltage underlayer power rail conductively connecting to the source region of a second-type transistor. Each of the first-voltage and second-voltage underlayer power rails extends in a first direction. The method also includes patterning a first connection layer to form a first-voltage power rail and a second-voltage power rail extending in the second direction which is perpendicular to the first direction. The first-voltage power rail is directly connected with the first-voltage underlayer power rail through a first via-connector and the second-voltage power rail is directly connected with the second-voltage underlayer power rail through a second via-connector.

20 Claims, 23 Drawing Sheets

(51) Int. Cl.
*G06F 30/392* (2020.01)
*H01L 21/768* (2006.01)
*H10D 84/01* (2025.01)
*H10D 84/03* (2025.01)
*H10D 89/10* (2025.01)
*H03K 17/687* (2006.01)

(52) U.S. Cl.
CPC ... *H01L 21/76885* (2013.01); *H10D 84/0186* (2025.01); *H10D 84/038* (2025.01); *H10D 89/10* (2025.01); *H03K 17/6872* (2013.01); *H03K 17/6874* (2013.01); *H10D 84/912* (2025.01); *H10D 84/948* (2025.01); *H10D 84/962* (2025.01); *H10D 84/966* (2025.01); *H10D 84/979* (2025.01); *H10D 84/981* (2025.01); *H10D 84/985* (2025.01); *H10D 84/987* (2025.01)

(58) Field of Classification Search
CPC .. H10D 84/948; H10D 84/962; H10D 84/966; H10D 84/979; H10D 84/981; H10D 84/985; H10D 84/987; H10D 84/135; H10D 62/343; H10D 30/0287; H10D 30/689; H10D 62/105; H10D 62/307; H10D 64/2523; H10D 64/671; H10D 84/141; H10D 84/891; H10D 84/971; H10D 12/01; G06F 30/31; G06F 30/392; H01L 21/76885; H01L 23/5286; H01L 21/76897; H01L 23/5386; H03K 17/6872; H03K 17/6874; A23B 2/783; H10H 20/8314

See application file for complete search history.

(56) References Cited

U.S. PATENT DOCUMENTS

| | | |
|---|---|---|
| 9,256,709 B2 | 2/2016 | Yu et al. |
| 2012/0119782 A1* | 5/2012 | Madurawe ........ H01L 27/11807 326/47 |
| 2014/0040838 A1 | 2/2014 | Liu et al. |
| 2015/0278429 A1 | 10/2015 | Chang |
| 2021/0167066 A1 | 6/2021 | Vishwanath |
| 2021/0210468 A1 | 7/2021 | Takeno |

* cited by examiner

POWER RAIL AND SIGNAL CONDUCTING LINE ARRANGEMENT

PRIORITY CLAIM

The present application is a divisional of U.S. application Ser. No. 17/395,126, filed Aug. 5, 2021 and issued as U.S. patent Ser. No. 11/967,596, which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
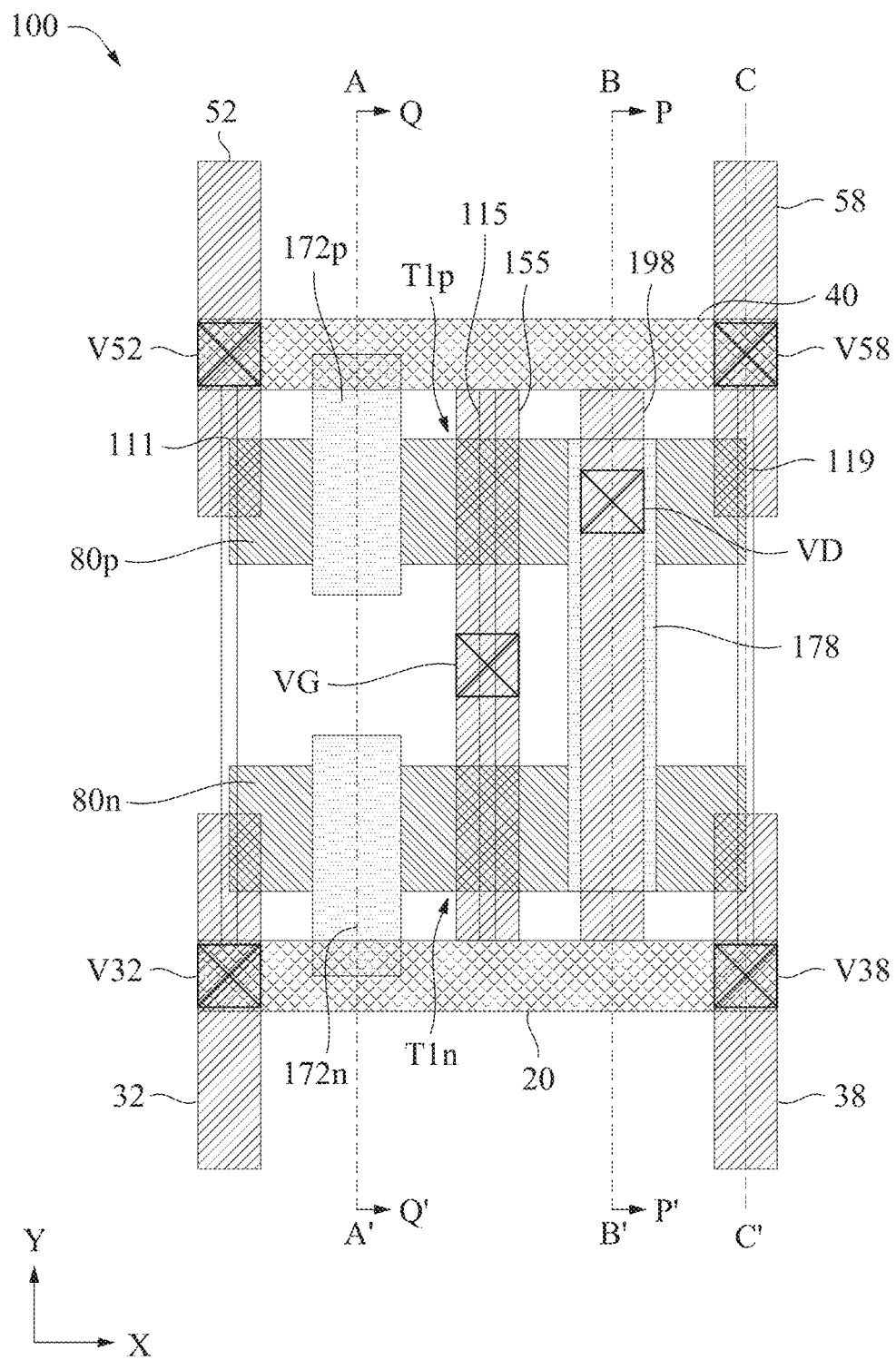
FIG. 1 is a layout diagram of an inverter circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit device generally includes various power rails for providing supply voltages to the transistors in the integrated circuit. The channel regions, the source regions, and the drain regions of the transistors are often aligned within the active zones extending in a first direction, while the gate-conductors intersecting the channel regions of the transistors generally extends in a second direction that is perpendicular to the first direction. The orientation of the signal conducting lines in a first connection layer (e.g., metal layer M0) immediately above the gate-conductors may influence the cell widths of various cells in the integrated circuit devices. In some embodiments, if underlayer power rails extending in the first direction are provided below the first connection layer and if the signal conducting lines extending in the second direction are provided in the first connection layer, the cell widths of some cells in the integrated circuit devices are reduced as compared to the cells in alternative implementations with different signal conducting line orientations. In some embodiments, power rails extending in the second direction are also provided in the first connection layer. While the widths of the power rails in the first connection layer are restricted by the adjacent signal conducting lines in the same first connection layer, the widths of the underlayer power rails nevertheless are not restricted by the signal conducting lines in the first connection layer. Furthermore, despite the widths of the power rails in the first connection layer are restricted, when the power rails in the first connection layer extends in the second direction, it is possible to increase the number of the power rails in the first connection layer for some of the cells. Larger width of underlayer power rails and/or larger placement density of the power rails in the first connection layer reduce both electromigration effects and IR Drops in the integrated circuit devices, which improves the overall reliability of the IC devices.

Figure 2A:
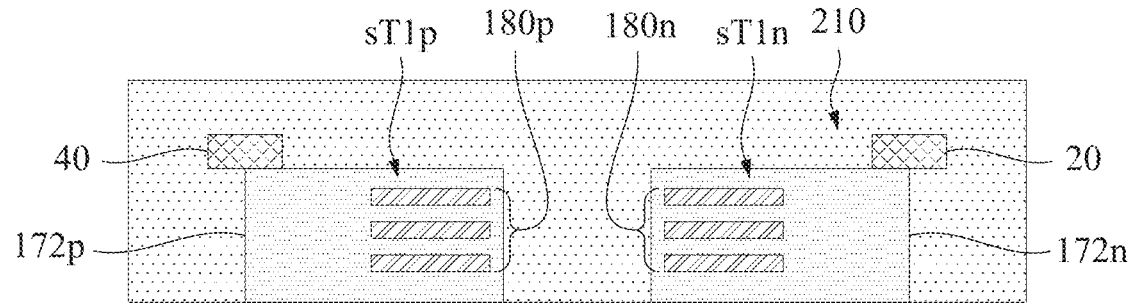
FIGS. 2A-2C are cross-sectional view of the inverter circuit as specified by the layout diagram in FIG. 1, in accordance with some embodiments.
Figure 2B:
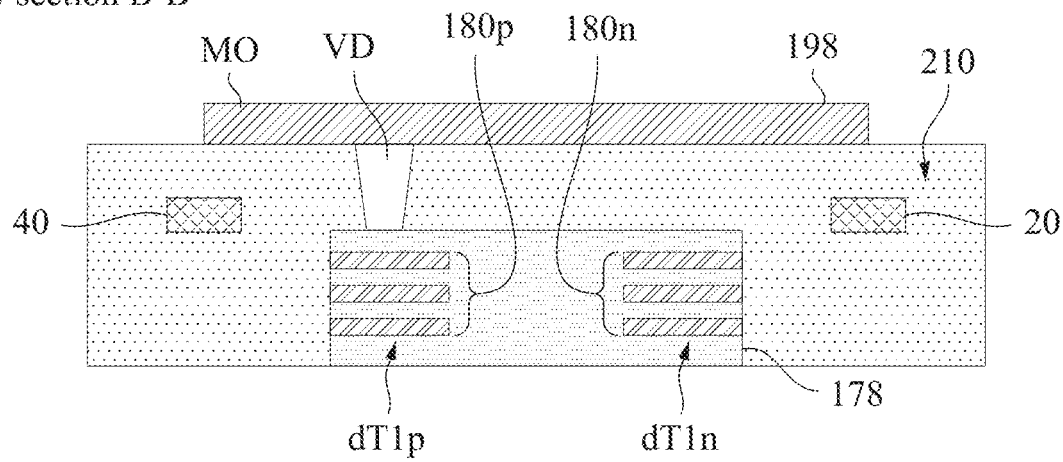
Figure 2C:
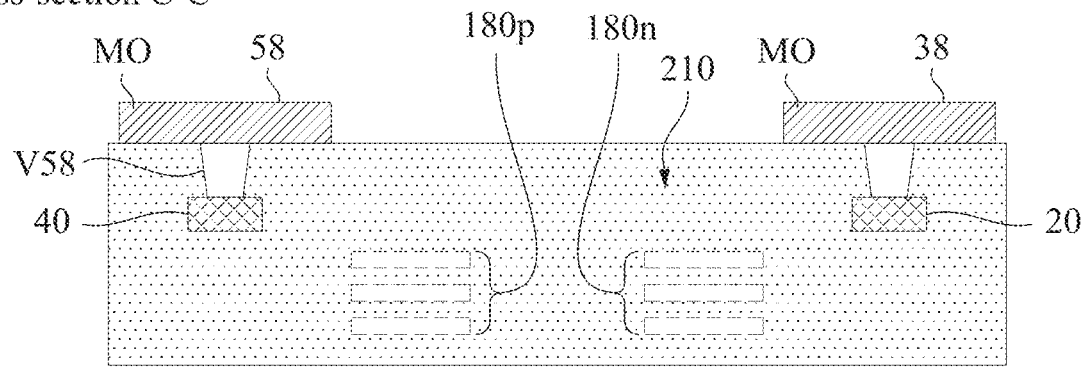

FIG. 1 is a layout diagram of an inverter circuit 100, in accordance with some embodiments. FIGS. 2A-2C are cross-sectional view of the inverter circuit as specified by the layout diagram in FIG. 1, in accordance with some embodiments. The layout diagram of FIG. 1 includes the layout patterns for specifying a p-type active zone 80$p$ and an n-type active zone 80$n$ both extending in the X-direction, a gate-conductor 115 extending in the Y-direction, terminal-conductors (172$p$, 172$n$, and 178) extending in the Y-direction, signal conducting lines 155 and 198 extending in the Y-direction, and various via-connectors. The layout diagram of FIG. 1 also includes the layout patterns for specifying a first-voltage underlayer power rail 40 and a second-voltage underlayer power rail 20 both extending in the X-direction, first-voltage power rails (52 and 58) and second-voltage power rails (32 and 38) all extending in the Y-direction.

In the inverter circuit 100 as specified by the layout diagram of FIG. 1, the gate-conductor 115 intersects a semiconductor structure in the p-type active zone 80$p$ at the channel region of a p-type transistor T1$p$. The gate-conductor 115 also intersects a semiconductor structure in the n-type active zone 80$n$ at the channel region of an n-type transistor T1$n$. The terminal-conductor 172$p$ intersects the semiconductor structure in the p-type active zone 80$p$ at the source region of the p-type transistor T1$p$. The terminal-conductor 172$n$ intersects the semiconductor structure in the n-type active zone 80$n$ at the source region of the n-type transistor T1$n$. The terminal-conductor 178 intersects the semiconductor structure in the p-type active zone 80$p$ at the drain region of the p-type transistor T1$p$, and intersects the semiconductor structure in the n-type active zone 80$n$ at the drain region of the n-type transistor T1$n$. In some embodiments, when the semiconductor structure in the p-type active zone 80$p$ and the semiconductor structure in the n-type active zone 80$n$ are fin structures, the p-type transistor T1$p$ and the n-type transistor T1$n$ are FinFETs. In some embodiments, when the semiconductor structure in the p-type active zone 80$p$ and the semiconductor structure in the n-type active zone 80$n$ are nano-sheet structures, the p-type transistor T1$p$ and the n-type transistor T1$n$ are nano-sheet transistors. In some embodiments, when the semiconductor structure in the p-type active zone 80$p$ and the semiconductor structure in the n-type active zone 80$n$ are nano-wire structures, the p-type transistor T1$p$ and the n-type transistor T1$n$ are nano-wire transistors. In FIG. 1, the dummy gate-conductor layout patterns 111 and 119 at the vertical boundaries of the inverter circuit 100 specify that the p-type active zone 80$p$ and the n-type active zone 80$n$ do not extend into adjacent cells. That is, none of the source regions, drain regions, and channel regions in the p-type active zone 80$p$ and the n-type active zone 80$n$ joints with other active regions (such as, source regions, drain regions, and channel regions) in the adjacent cells.

In the inverter circuit 100 as specified by the layout diagram of FIG. 1, the signal conducting lines 155 and 198 are positioned in a first connection layer M0 (as shown in FIGS. 2A-2C), which overlies the insulating material directly covering the gate-conductor 115 and the terminal-conductors (172$p$, 172$n$, and 178). The signal conducting line 155 is conductively connected to the gate-conductor 115 through the gate via-connector VG. The signal conducting line 198 is conductively connected to the terminal-conductor 178 through the terminal via-connector VD. The first-voltage power rails (52, 58) and the second-voltage power rails (32, 38) are in the first connection layer M0. The first-voltage underlayer power rail 40 and the second-voltage underlayer power rail 20 are below the first connection layer. The first-voltage underlayer power rail 40 is conductively connected to the first-voltage power rails 52 and 58 correspondingly through the via-connectors V52 and V58. The first-voltage underlayer power rail 40 is also conductively connected to the terminal-conductor 172$p$. The second-voltage underlayer power rail 20 is conductively connected to the second-voltage power rails 32 and 38 correspondingly through the via-connectors V32 and V38. The second-voltage underlayer power rail 20 is also conductively connected to the terminal-conductor 172$n$.

In some embodiments, as shown in FIG. 1, the conductive connection between the first-voltage underlayer power rail 40 and the terminal-conductor 172$p$ in an IC device is specified in the layout diagram by a common overlap region between the layout pattern for the first-voltage underlayer power rail 40 and the layout pattern for the terminal-conductor 172$p$. In some alternative embodiments, a connection symbol (such as a via-connector pattern) is placed in the above described common overlap region to specify that the first-voltage underlayer power rail 40 is conductively connected to the terminal-conductor 172$p$. Similarly, in some embodiments, as shown in FIG. 1, the conductive connection between the second-voltage underlayer power rail 20 and the terminal-conductor 172$n$ in an IC device is specified in the layout diagram by a common overlap region between the layout pattern for the second-voltage underlayer power rail 20 and the layout pattern for the terminal-conductor 172$n$. In some alternative embodiments, a connection symbol (such as a via-connector pattern) is placed in the above described common overlap region in the layout diagram to specify that the second-voltage underlayer power rail 20 is conductively connected to the terminal-conductor 172$n$. As a comparison, in the layout diagram of FIG. 1, because the layout pattern for the terminal-conductor 178 does not overlap with the layout patterns for the first-voltage underlayer power rail 40 and the second-voltage underlayer power rail 20, the terminal-conductor 178 does not form direct conductive connections with the first-voltage underlayer power rail 40 and the second-voltage underlayer power rail 20 in the IC device as specified by the layout diagram.

FIG. 2A is a cross-sectional view of the inverter circuit 100 as specified by FIG. 1 in a cutting plane A-A', in accordance with some embodiments. In FIG. 2A, the terminal-conductor 172$p$ intersects the semiconductor structure 180$p$ (in the p-type active zone 80$p$) at the source region sT1$p$ of the p-type transistor T1$p$ (which is identified in FIG. 1), and the terminal-conductor 172$n$ intersects the n-type first semiconductor structure 180$n$ (in the n-type active zone 80$n$) at the source region sT1$n$ of the n-type transistor T1$n$ (which is identified in FIG. 1). The lower surface of the first-voltage underlayer power rail 40 is either at the same level as the upper surface of the terminal-conductor 172*p* or at a level above the upper surface of the terminal-conductor 172*p*. The second-voltage underlayer power rail 20 is either at the same level as the upper surface of the terminal-conductor 172*n* or at a level above the upper surface of the terminal-conductor 172*n*. The first-voltage underlayer power rail 40, the second-voltage underlayer power rail 20, and the terminal-conductors (172*p* and 172*n*) are covered by the insulating material 210.

In some embodiments, a portion of the first-voltage underlayer power rail 40 overlies directly on the upper surface of the terminal-conductor 172*p* and forms a direct conductive contact with the terminal-conductor 172*p*. In some alternative embodiments, the first-voltage underlayer power rail 40, while above the terminal-conductor 172*p*, is conductively connected to the terminal-conductor 172*p* through an opening in the insulating material 210 between the first-voltage underlayer power rail 40 and the terminal-conductor 172*p*. Similarly, in some embodiments, a portion of the second-voltage underlayer power rail 20 overlies directly on the supper surface of the terminal-conductor 172*n* and forms a direct conductive contact with the terminal-conductor 172*n*. In some alternative embodiments, the second-voltage underlayer power rail 20, while above the terminal-conductor 172*n*, is conductively connected to the terminal-conductor 172*n* through an opening in the insulating material 210 between the second-voltage underlayer power rail 20 and the terminal-conductor 172*n*.

FIG. 2B is a cross-sectional view of the inverter circuit 100 as specified by FIG. 1 in a cutting plane B-B', in accordance with some embodiments. In FIG. 2B, the terminal-conductor 178 intersects the semiconductor structure 180*p* (in the p-type active zone 80*p*) at the drain region dT1*p* of the p-type transistor T1*p* (which is identified in FIG. 1) and intersects the semiconductor structure 180*n* (in the n-type active zone 80*n*) at the drain region dT1*n* of the n-type transistor T1*n* (which is identified in FIG. 1). In some embodiments, the lower surfaces of the first-voltage underlayer power rail 40 and the second-voltage underlayer power rail 20 are at the same level as the upper surface of the terminal-conductor 178. In some embodiments, the lower surfaces of the first-voltage underlayer power rail 40 and the second-voltage underlayer power rail 20 are at a level above the upper surface of the terminal-conductor 178. The first-voltage underlayer power rail 40, the second-voltage underlayer power rail 20, and the terminal-conductor 178 are covered by the insulating material 210. The signal conducting line 198, which is in the first connection layer M0, overlies the insulating material 210. Both the first-voltage underlayer power rail 40 and the second-voltage underlayer power rail 20 are positioned below the first connection layer M0. The signal conducting line 198 is conductively connected to the terminal-conductor 178 through the terminal via-connector VD.

FIG. 2C is a cross-sectional view of the inverter circuit 100 as specified by FIG. 1 in a cutting plane C-C', in accordance with some embodiments. In FIG. 2C, the first-voltage power rail 58 and the second-voltage power rail 38, which is in the first connection layer M0, overlies the insulating material 210. The first-voltage power rail 58 is conductively connected to the first-voltage underlayer power rail 40 through the via-connector V58, and the second-voltage power rail 38 is conductively connected to the second-voltage underlayer power rail 20 through the via-connector V38. In operation, the first-voltage power rail 58 is configured to be maintained at a first supply voltage (such as a voltage VDD), and the second-voltage power rail 38 is configured to be maintained at a second supply voltage (such as a voltage VSS).

Figure 3A:
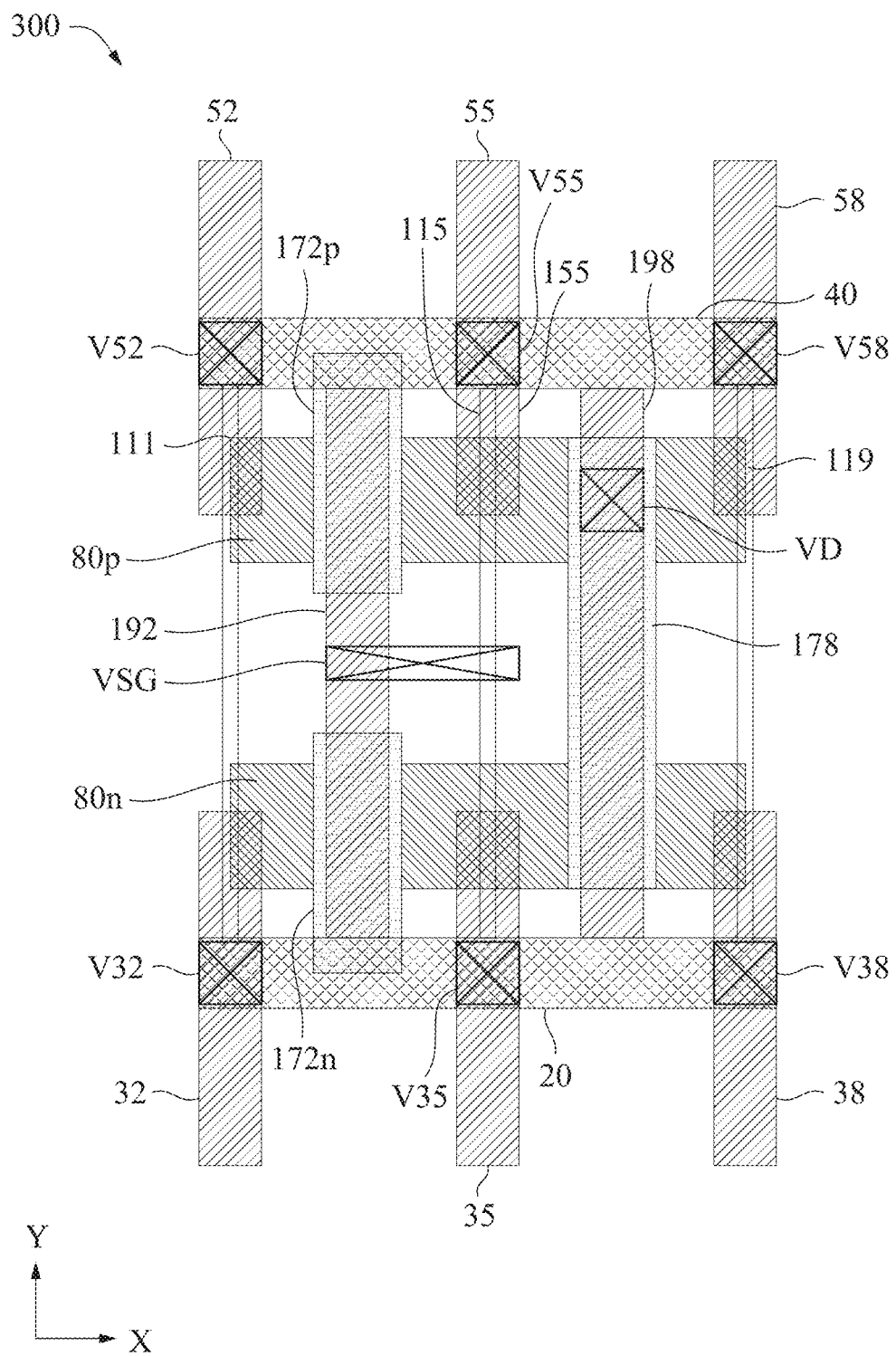
FIG. 3A is a layout diagram of an inverter circuit having a slot via-connector, in accordance with some embodiments.
Figure 3B:
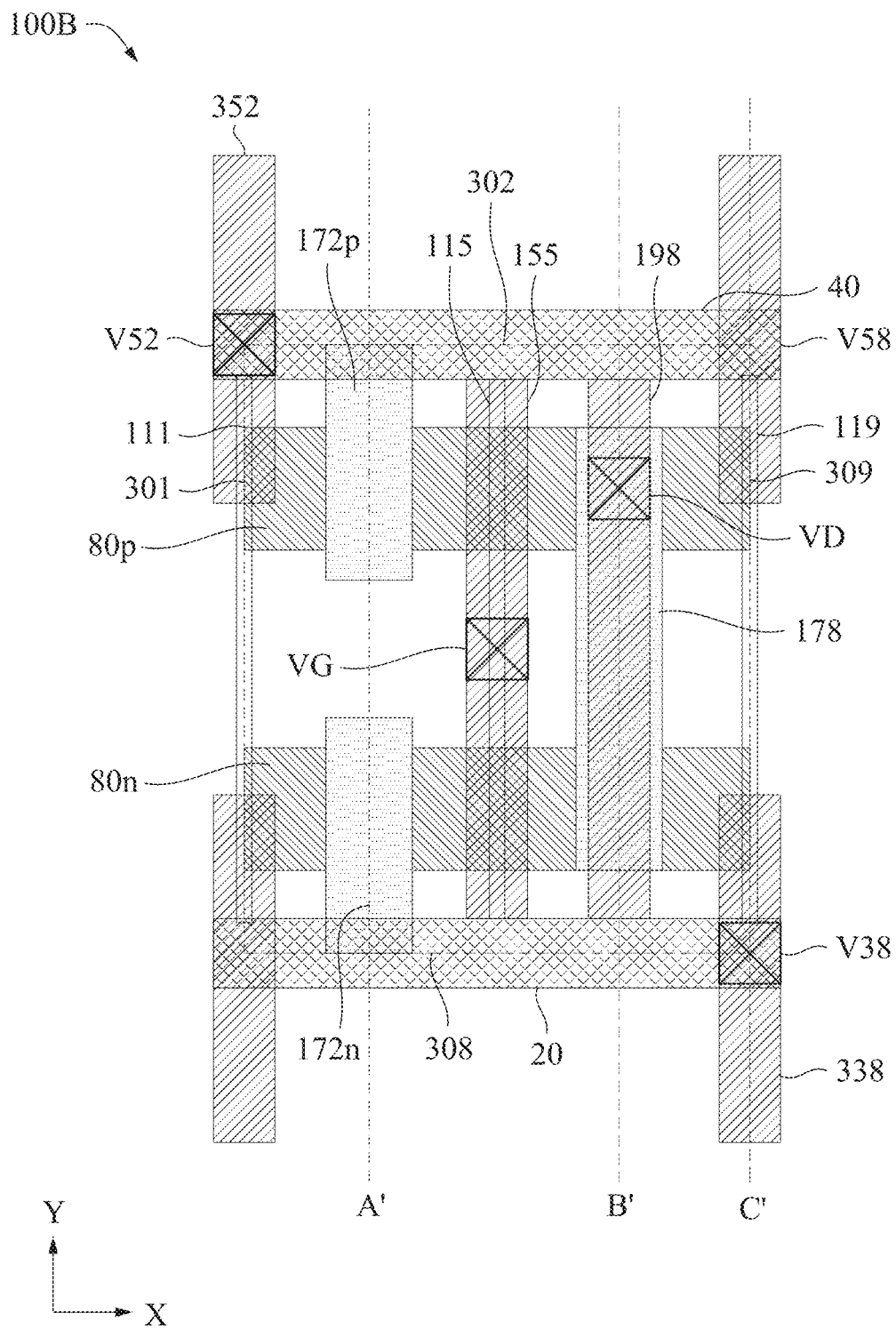
FIG. 3B is a layout diagram of an inverter circuit having one power rail at each vertical boundary of the cell, in accordance with some embodiments.

Various variations of the layout diagram in the FIG. 1 are depicted in FIGS. 3A-3B. FIG. 3A is a layout diagram of an inverter circuit 300 having a slot via-connector, in accordance with some embodiments. The layout diagram in the FIG. 3A is modified from the layout diagram in the FIG. 1. The modification includes adding a first-voltage power rail 55 and a second-voltage power rail 35, replacing the signal conducting line 155 with the signal conducting line 192, and replacing the gate via-connector VG with the slot gate via-connector VSG. The signal conducting line 192 is conductively connected to the gate-conductor 115 through the slot gate via-connector VSG. In FIG. 3A, because the slot gate via-connector VSG is extending in the X-direction, it becomes possible to connect the signal conducting line 192 to the gate-conductor 115, even though the signal conducting line 192 and the gate-conductor 115 are shifted from each other along the X-direction.

In FIG. 3A, the first-voltage power rail 55 and the second-voltage power rail 35 are all positioned in the first connection layer M0. The first-voltage power rail 55 and the second-voltage power rail 35, while aligned with the gate-conductor 115, are separated from the first-voltage power rail 52 and the second-voltage power rail 32 along the X-direction by one Contacted Poly Pitch (CPP) distance. Here, one CPP distance is the pitch distance between two adjacent gate-conductors. The first-voltage power rail 55 is conductively connected to the first-voltage underlayer power rail 40 through the via-connector V55, and the second-voltage power rail 35 is conductively connected to the second-voltage underlayer power rail 20 through the via-connector V35. In some embodiments, when the first-voltage power rail 55 is separated from the first-voltage power rail 52 by at least one CPP distance, the via-connector V55 and the via-connector V52 are able to be placed next to each other as shown in FIG. 3A without violating the design rules. Similarly, when the second-voltage power rail 35 is separated from the second-voltage power rail 32 by at least one CPP distance, the via-connector V35 and the via-connector V32 are able to be placed next to each other as shown in FIG. 3A without violating the design rules.

FIG. 3B is a layout diagram of an inverter circuit 100 having one power rail at each vertical boundary of the cell, in accordance with some embodiments. The layout diagram in the FIG. 3B is modified from the layout diagram in the FIG. 1. The modification includes removing the second-voltage power rail 32, the first-voltage power rail 58, and the via-connectors V32 and V58. The modification also includes replacing the first-voltage power rail 52 with the first-voltage power rail 352, and replacing the second-voltage power rail 38 with the second-voltage power rail 338.

In FIG. 3B, the first-voltage power rail 352 is sufficiently extended in the Y-direction to completely cover the vertical boundary 301 of the cell containing the inverter circuit. The second-voltage power rail 338 is sufficiently extended in the Y-direction to completely cover the vertical boundary 309 of the cell containing the inverter circuit. Additionally, the first-voltage power rail 352 extends, along the vertical boundary 301, from a first adjacent cell (which shares the horizontal boundary 302 with the inverter circuit 100 cell) to a second adjacent cell (which shares the horizontal boundary 308 with the inverter circuit 100 cell). The second-voltage power rail 338 extends, along the vertical boundary 309, from the first adjacent cell to the second adjacent cell. The first-voltage power rail 352 is configured to provide the first supply voltage (such as VDD) to each of the first adjacent cell, the inverter circuit 100 cell, and the second adjacent cell. The second-voltage power rail 338 is configured to provide the second supply voltage (such as VSS) to each of the first adjacent cell, the inverter circuit 100 cell, and the second adjacent cell. In FIG. 3B, the first-voltage power rail 352 is conductively connected to the first-voltage underlayer power rail 40 through the via-connector V58, and the second-voltage power rail 338 is conductively connected to the second-voltage underlayer power rail 20 through the via-connector V38.

Figure 4A:
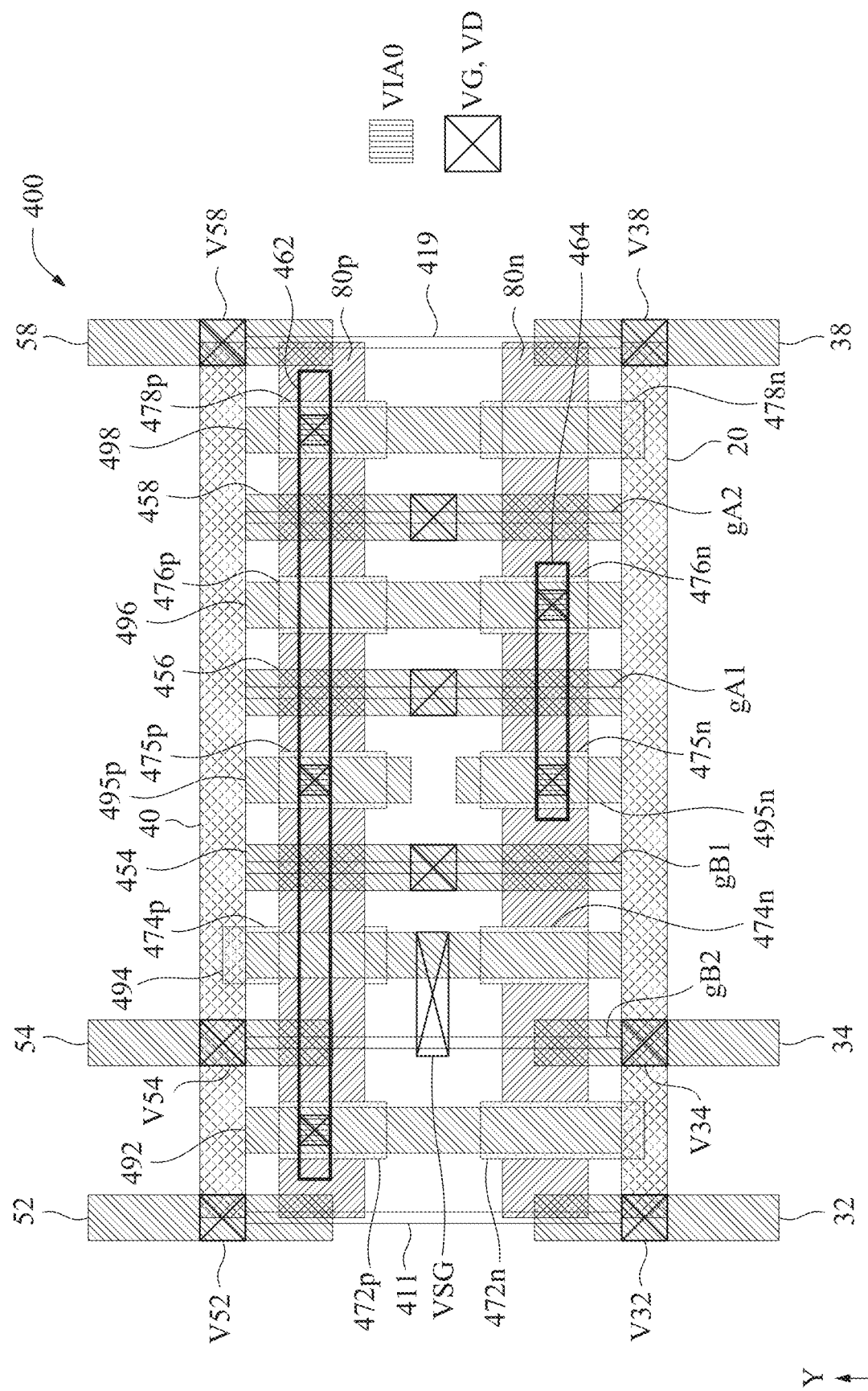
FIG. 4A is a layout diagram of an And-Or-Invertor logic circuit having underlayer power rails, in accordance with some embodiments.
Figure 4B:
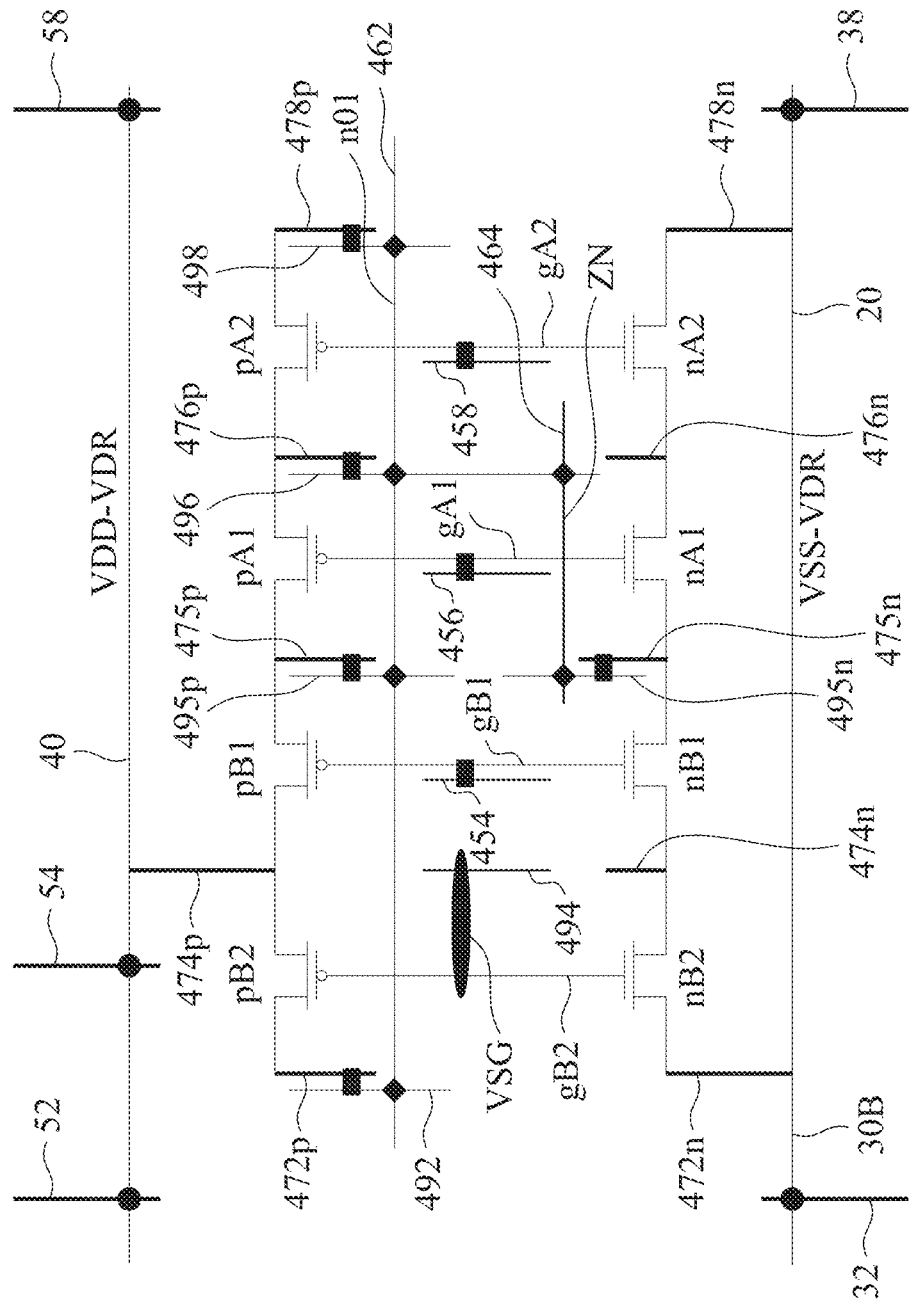
FIG. 4B is an equivalent circuit of the And-Or-Invertor logic circuit as specified by the layout diagram in FIG. 4A, in accordance with some embodiments.

FIG. 4A is a layout diagram of an And-Or-Invertor ("AOI") logic circuit having underlayer power rails, in accordance with some embodiments. FIG. 4B is an equivalent circuit of the AOI logic circuit 400 as specified by the layout diagram in FIG. 4A, in accordance with some embodiments. The AOI logic circuit 400 as specified by the layout diagram in FIG. 4A is an example of the 2-2 AOI logic circuit in FIG. 4C.

Figure 4C:
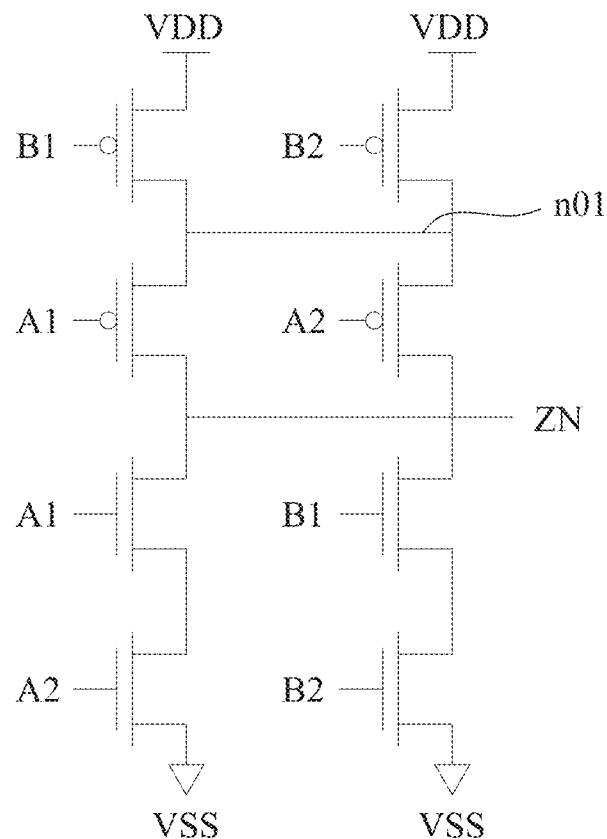
FIG. 4C is a circuit diagram of the And-Or-Invertor logic circuit in FIG. 4A, in accordance with some embodiments.

In FIG. 4C, the source terminals of the p-type transistors having inputs B1 and B2 are connected to the power supply VDD. The drain terminals of the p-type transistors having inputs B1 and B2 are connected together as the node n01. The source terminals of the p-type transistors having inputs A1 and A2 are also connected to the node n01. The drain terminals of the p-type transistors having inputs A1 and A2 are connected together as the output terminal ZN. The drain terminals of the n-type transistors having inputs A1 and B1 are also connected to the output terminal ZN. The source terminal of the n-type transistor having inputs A1 is connected to the drain terminal of the n-type transistor having input A2, and the source terminal of the n-type transistor having inputs B1 is connected to the drain terminal of the n-type transistor having input B2. The source terminals of the n-type transistors having inputs A2 and B2 are connected to the power supply VSS.

The layout diagram of FIG. 4A includes the layout patterns for specifying a p-type active zone 80*p* and an n-type active zone 80*n* both extending in the X-direction, the layout patterns for specifying a first-voltage underlayer power rail 40 and a second-voltage underlayer power rail 20 both extending in the X-direction, and the layout patterns for specifying the first-voltage power rails (52, 54, and 58) and the second-voltage power rails (32 and 38) all extending in the Y-direction. The layout diagram of FIG. 4A also includes the layout patterns for specifying the gate-conductors (gB2, gB1, gA1, and gA2) extending in the Y-direction, the layout patterns for specifying the terminal-conductors (472*p*, 472*n*, 474*p*, 474*n*, 475*p*, 475*n*, 476*p*, 476*n*, 478*p*, and 478*n*) extending in the Y-direction, and the dummy gate-conductor layout patterns (111 and 119) extending in the Y-direction at the cell boundaries. The layout diagram of FIG. 4A also includes the layout patterns for the signal conducting lines (492, 494, 495*p*, 495*n*, 496, and 498) aligned with the corresponding terminal-conductors extending in the Y-direction, the layout patterns for the signal conducting lines (454, 456, and 458) extending in the Y-direction aligned the corresponding gate-conductors, the layout patterns for the horizontal signal conducting lines (462 and 464) extending in the X-direction, and the layout patterns for various via-connectors.

In the AOI logic circuit 400 as specified by the layout diagram in FIG. 4A, each of the gate-conductors gB2, gB1, gA1, and gA2, extending in the Y-direction, intersects the p-type active zone 80*p* and correspondingly forms the gate terminals of the p-type transistors pB2, pB1, pA1, and pA2 (as identified in FIG. 4B). Each of the gate-conductors gB2, gB1, gA1, and gA2 also intersects the n-type active zone 80*n* and correspondingly forms the gate terminals of the n-type transistors nB2, nB1, nA1, and nA2 (as identified in FIG. 4B). The terminal-conductors 472*p*, 474*p*, 475*p*, 476*p*, and 478*p* overlap the p-type active zone 80*p* and form the source/drain terminals of the p-type transistors. The terminal-conductors 472*n*, 474*n*, 475*n*, 476*n*, and 478*n* overlap the n-type active zone 80*n* and form the source/drain terminals of the n-type.

In the AOI logic circuit 400, as shown in FIGS. 4A-4B, the gate terminals of the p-type transistor pB2 and the n-type transistor nB2 are connected together by the gate-conductor gB2, the gate terminals of the p-type transistor pB1 and the n-type transistor nB1 are connected together by the gate-conductor gB1, the gate terminals of the p-type transistor pA1 and the n-type transistor nA1 are connected together by the gate-conductor gA1, and the gate terminals of the p-type transistor pA2 and the n-type transistor nA2 are connected together by the gate-conductor gA2. The gate-conductor gB2 is conductively connected to the signal conducting line 494 through a slot gate via-connector VSG. Each of the gate-conductors gB1, gA1, and gA2 is correspondingly connected to one of the signal conducting lines 454, 456, and 458 through a gate via-connector VG. Each of the signal conducting lines 494, 454, 456, and 458 (correspondingly connected to the gate-conductors gB2, gB1, gA1, and gA2) is configured to receive one of the corresponding input signals B2, B1, A1, and A2.

In the AOI logic circuit 400, as shown in FIGS. 4A-4B, each of the terminal-conductors 472*p*, 475*p*, and 478*p* is correspondingly connected to one of the signal conducting lines 492, 495*p*, and 498 through a terminal via-connector VD. Each of the signal conducting lines 492, 495*p*, and 498 is conductively connected to the horizontal signal conducting line 462 through a via-connector VIA0. Consequently, the drain terminals of the p-type transistors pB2 and pB1 are conductively connected to the source terminals of the p-type transistors pA1 and pA2 through the horizontal signal conducting line 462. Furthermore, in the AOI logic circuit 400, each of the terminal-conductors 476*p* and 475*n* is correspondingly connected to one of the signal conducting lines 496 and 495*n* through a terminal via-connector VD. Each of the signal conducting lines 476 and 495*n* is conductively connected to the horizontal signal conducting line 464 through a via-connector VIA0. Consequently, the drain terminals of the p-type transistors pA1 and pA2 are conductively connected to the drain terminals of the n-type transistors nB1 and nA1 through the horizontal signal conducting line 464 (which is configured to carry the output signal ZN). In the AOI logic circuit 400 as specified by the layout diagram in FIG. 4A, the horizontal signal conducting lines 462 and 464 are in a second connection layer M1, which overlies the interlayer dielectric (ILD) materials separating the second connection layer M1 and the first connection layer M0. In the AOI logic circuit 400 as specified by the layout diagram in FIG. 4A, each of the via-connectors VIA0 passes through the ILD materials separating the second connection layer M1 and the first connection layer M0.

In the AOI logic circuit 400, as shown in FIGS. 4A-4B, the terminal-conductor 474*p* is conductively connected to the first-voltage underlayer power rail 40 (which is also labeled as VDD-VDR in FIG. 4B), and each of the terminal-conductors 472*n* and 478*n* is conductively connected to the second-voltage underlayer power rail 20 (which is also labeled as VSS-VDR in FIG. 4B). In the AOI logic circuit 400, the first-voltage underlayer power rail 40 and the second-voltage underlayer power rail 20 are below the first connection layer M0. The first-voltage underlayer power rail 40 is conductively connected to the first-voltage power rails 52, 54, and 58 correspondingly through the via-connectors V52, V54, and V58, while the second-voltage underlayer power rail 20 is conductively connected to the second-voltage power rails 32, 34, and 38 correspondingly through the via-connectors V32, V34, and V38. In some embodiments, in the AOI logic circuit 400 of FIG. 4B, when the first-voltage power rails 52, 54, and 58 are configured to receive the supply voltage VDD, the source terminals of the p-type transistors pB2 and pB1 are configured to be maintained at the supply voltage VDD. Similarly, in some embodiments, when the second-voltage power rails 32, 34, and 38 are configured to receive the supply voltage VSS, the source terminals of the n-type transistors nB2 and nA2 are configured to be maintained at the supply voltage VSS.

In the AOI logic circuit 400 as specified by the layout diagram in FIG. 4A, the signal conducting lines in the first connection layer M0 extend in a first direction which is the same extending direction of the gate-conductors, and the underlayer power rails (positioned below the first connection layer) extend in an orthogonal second direction. Due to the orientation of the signal conducting lines in the first connection layer M0 and the orientation of the underlayer power rails, the AOI logic circuit 400 as specified in FIG. 4A has a reduced cell width along the X-direction as compared with alternative implementations (in which the signal conducting lines in the first connection layer M0 extend in an orthogonal direction crossing the gate-conductors). For example, the AOI logic circuit 400 as specified in FIG. 4A has a cell width of 5 CPP, while alternative implementations with different signal conducting line orientations have a cell width of at least 6 CPP.

Figure 5A:
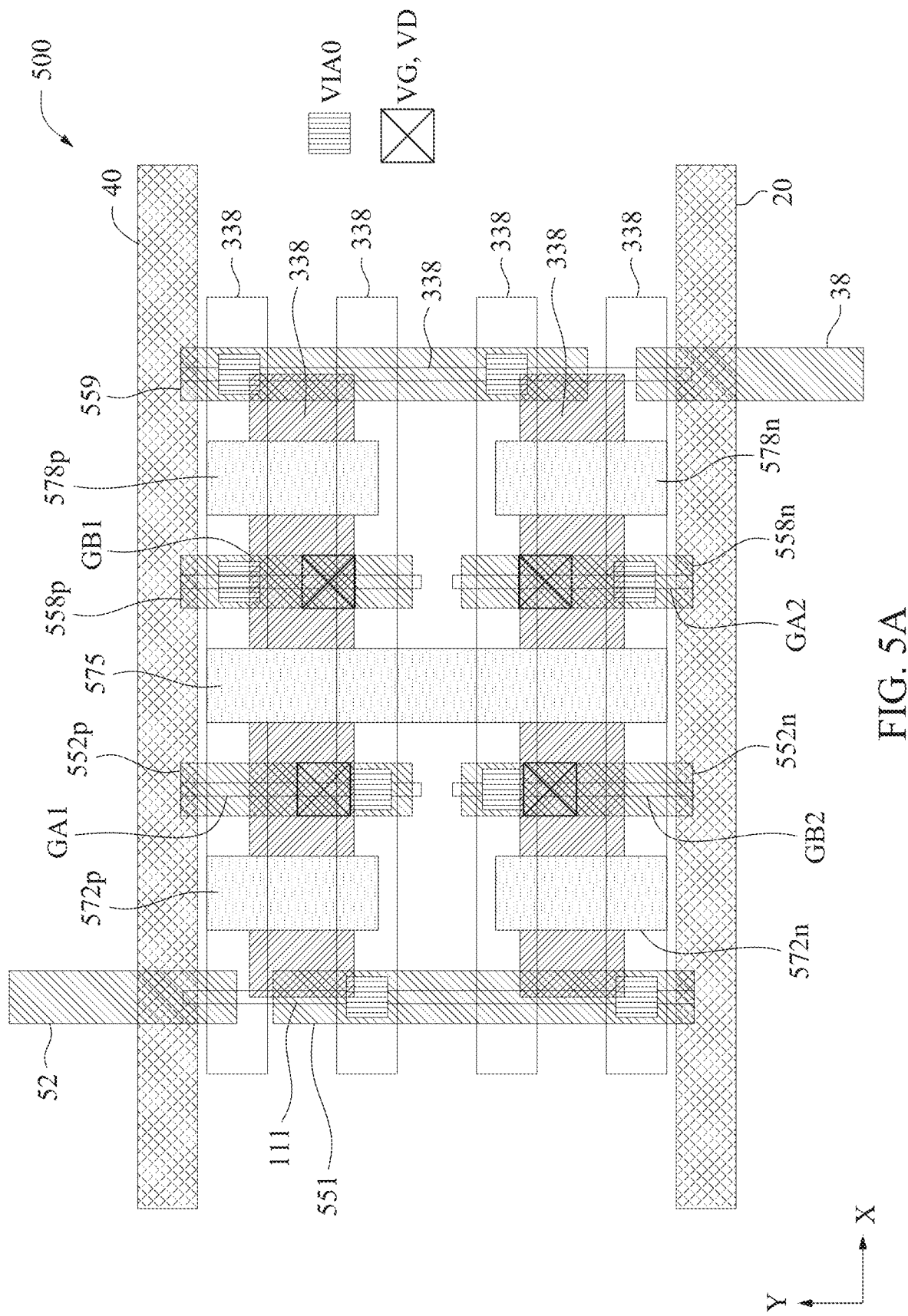
FIG. 5A is a layout diagram of a transmission gate circuit having underlayer power rails, in accordance with some embodiments.
Figure 5B:
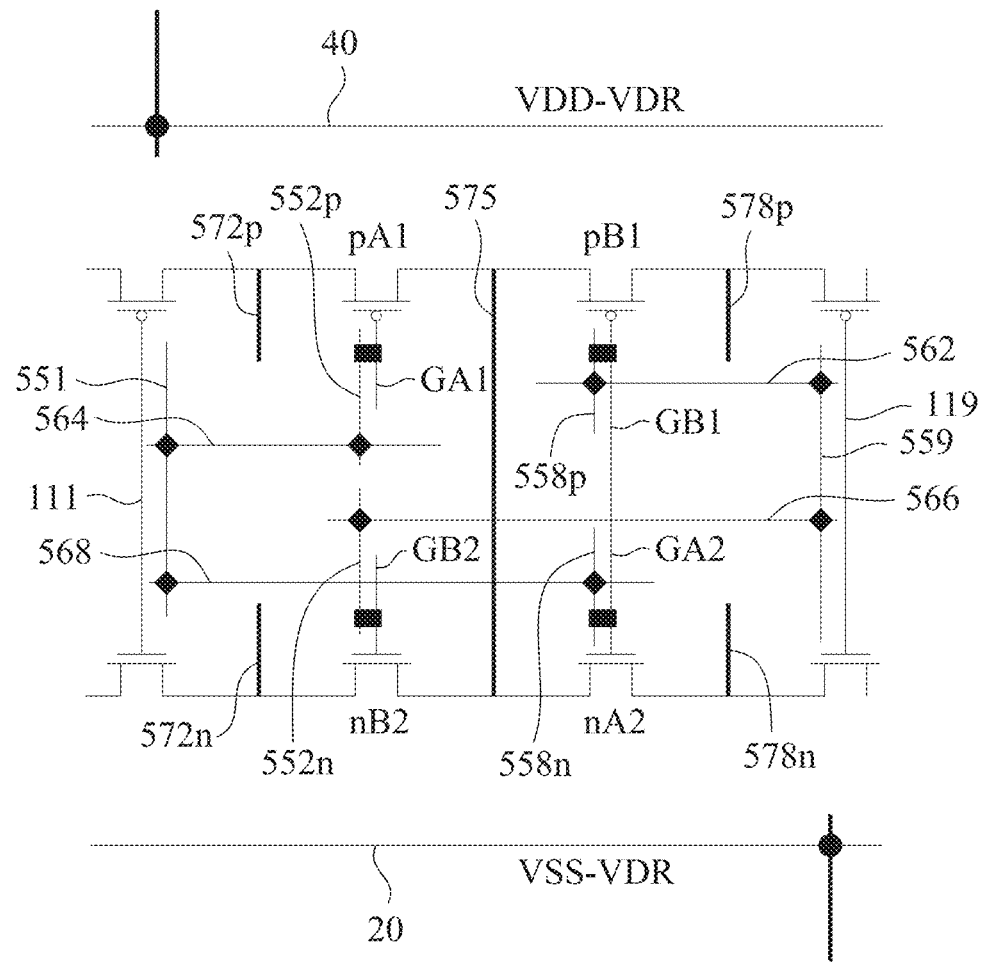
FIG. 5B is an equivalent circuit of the transmission gate circuit as specified by the layout diagram in FIG. 5A, in accordance with some embodiments.

FIG. 5A is a layout diagram of a transmission gate circuit 500 having underlayer power rails, in accordance with some embodiments. FIG. 5B is an equivalent circuit of the transmission gate circuit 500 as specified by the layout diagram in FIG. 5A, in accordance with some embodiments. The transmission gate circuit 500 as specified by the layout diagram in FIG. 5A is an example of the transmission gate circuit in FIG. 5C.

Figure 5C:
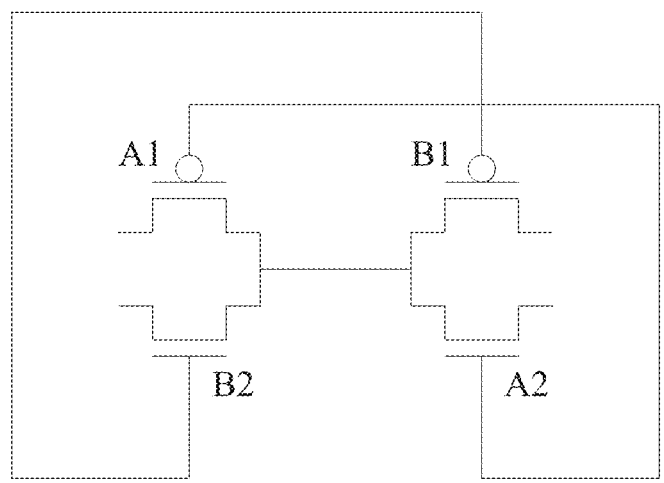
FIG. 5C is a circuit diagram of the transmission gate circuit in FIG. 5A, in accordance with some embodiments.

In FIG. 5C, a transmission gate circuit includes two p-type transistors and two n-type transistors. One of the two p-type transistors has a gate "A1" and another one of the two p-type transistors has a gate "B1." One of the two n-type transistors has a gate "B2" and another one of the two n-type transistors has a gate "A1." The gate "A1" of the p-type transistor is connected to the gate "A2" of the n-type transistor. The gate "B1" of the p-type transistor is connected to the gate "B2" of the n-type transistor. Each of the two p-type transistors has one source/drain terminal jointed together and connected as a joint node. Each of the two n-type transistors has one source/drain terminal joined together and connected to the joint node.

The layout diagram of FIG. 5A includes the layout patterns for specifying a p-type active zone 80p and an n-type active zone 80n both extending in the X-direction, the layout patterns for specifying a first-voltage underlayer power rail 40 and a second-voltage underlayer power rail 20 both extending in the X-direction, and the layout patterns for specifying the first-voltage power rail 52 and the second-voltage power rail 38 both extending in the Y-direction. The layout diagram of FIG. 5A also includes the layout patterns for specifying the gate-conductors (gA1, gB1, gB2, and gA2) extending in the Y-direction, and the layout patterns for specifying the terminal-conductors (572p, 572n, 475, 578p, and 578n) extending in the Y-direction, and the dummy gate-conductor layout patterns (111 and 119) extending in the Y-direction at the cell boundaries. The layout diagram of FIG. 5A also includes the layout patterns for the signal conducting lines (551, 552p, 552n, 558p, 558n, and 559) extending in the Y-direction, the layout patterns for the horizontal signal routing lines (562, 564, 566 and 568) extending in the X-direction, and the layout patterns for various via-connectors.

In the transmission gate circuit 500 as specified by the layout diagram in FIG. 5A, the signal conducting lines (551, 552p, 552n, 558p, 558n, and 559) extending in the Y-direction are in the first connection layer M0. The horizontal signal routing lines (562, 564, 566 and 568) extending in the X-direction are in the second connection layer M1, which overlies the interlayer dielectric (ILD) materials separating the second connection layer M1 and the first connection layer M0.

In the transmission gate circuit 500 as specified by the layout diagram in FIG. 5A, each of the gate-conductors gA1 and gB1, extending in the Y-direction, intersects the p-type active zone 80p and correspondingly forms the gate terminals of the p-type transistors pA1 and pB1 (as identified in FIG. 5B). Each of the gate-conductors gB2 and gA2, extending in the Y-direction, intersects the n-type active zone 80n and correspondingly forms the gate terminals of the n-type transistors nB2 and nA2 (as identified in FIG. 5B). The terminal-conductors 572p, 575, and 578p intersect the p-type active zone 80p and form the source/drain terminals of the p-type transistors pA1 and pB1. The terminal-conductors 572n, 575, and 578n intersect the n-type active zone 80n and form the source/drain terminals of the n-type transistors nB2 and nA2.

In the transmission gate circuit 500, as shown in FIGS. 5A-5B, the gate-conductor gA1 is conductively connected to the signal conducting line 552p through a corresponding gate via-connector VG, the signal conducting line 552p is conductively connected to the horizontal signal routing lines 564 through a corresponding gate via-connector VIA0, and the horizontal signal routing lines 564 is conductively connected to the signal conducting line 551 through a corresponding gate via-connector VIA0. In addition, the signal conducting line 551 is conductively connected to the horizontal signal conducting lines 568 through a corresponding gate via-connector VIA0, the horizontal signal conducting lines 568 is conductively connected to the signal conducting line 558n through a corresponding gate via-connector VIA0, and the signal conducting line 558n is conductively connected to the gate-conductor gA2 through a corresponding gate via-connector VG. Consequently, the gate-conductor gA1 is conductively connected to the gate-conductor gA2.

Similarly, as shown in FIGS. 5A-5B, the gate-conductor gB1 is conductively connected to the signal conducting line 558p through a corresponding gate via-connector VG, the signal conducting line 558p is conductively connected to the horizontal signal routing lines 562 through a corresponding gate via-connector VIA0, and the horizontal signal routing lines 562 is conductively connected to the signal conducting line 559 through a corresponding gate via-connector VIA0. In addition, the signal conducting line 559 is conductively connected to the horizontal signal routing lines 566 through a corresponding gate via-connector VIA0, the horizontal signal routing lines 566 is conductively connected to the signal conducting line 552n through a corresponding gate via-connector VIA0, and the signal conducting line 552n is conductively connected to the gate-conductor gB2 through a corresponding gate via-connector VG. Consequently, the gate-conductor gB1 is conductively connected to the gate-conductor gB2.

In the AOI logic circuit 400 as specified by the layout diagram in FIG. 4A, the signal conducting lines in the first connection layer M0 extend in a first direction which is the same extending direction of the gate-conductors, and the underlayer power rails (positioned below the first connection layer) extend in an orthogonal second direction. Due to the orientation of the signal conducting lines in the first connection layer M0 and the orientation of the underlayer power rails, the AOI logic circuit 400 as specified in FIG. 4A has a reduced cell width along the X-direction as compared with alternative implementations (in which the signal conducting lines in the first connection layer M0 extend in an orthogonal direction crossing the gate-conductors). For example, the AOI logic circuit 400 as specified in FIG. 4A has a cell width of 5 CPP, while alternative implementations with different signal conducting line orientations have a cell width of at least 6 CPP.

In the transmission gate circuit 500 as specified by the layout diagram in FIG. 5A, the signal conducting lines in the first connection layer M0 extend in a first direction which is the same extending direction of the gate-conductors, and the underlayer power rails (positioned below the first connection layer) extend in an orthogonal second direction. Due to the orientation of the signal conducting lines in the first connection layer M0 and the orientation of the underlayer power rails, the signal connections in the transmission gate circuit 500 as specified in FIG. 5A are conducted by the signal conducting lines in the first connection layer M0 and the horizontal signal conducting lines in the second connection layer M1. As a comparison, in some alternative implementations (in which the signal conducting lines in the first connection layer M0 extends in an orthogonal direction crossing the gate-conductors), a different layout of the transmission gate circuit in FIG. 5C require a routing line in the third connection layer M2 to complete the signal connections. The cell width of the transmission gate circuit 500 in some alternative implementations is larger than the cell width of the transmission gate circuit 500 as specified in FIG. 5A. The third connection layer M2 (which is above the second connection layer M1) overlies the interlayer dielectric (ILD) materials separating the third connection layer M2 and the second connection layer M1.

Figure 6:
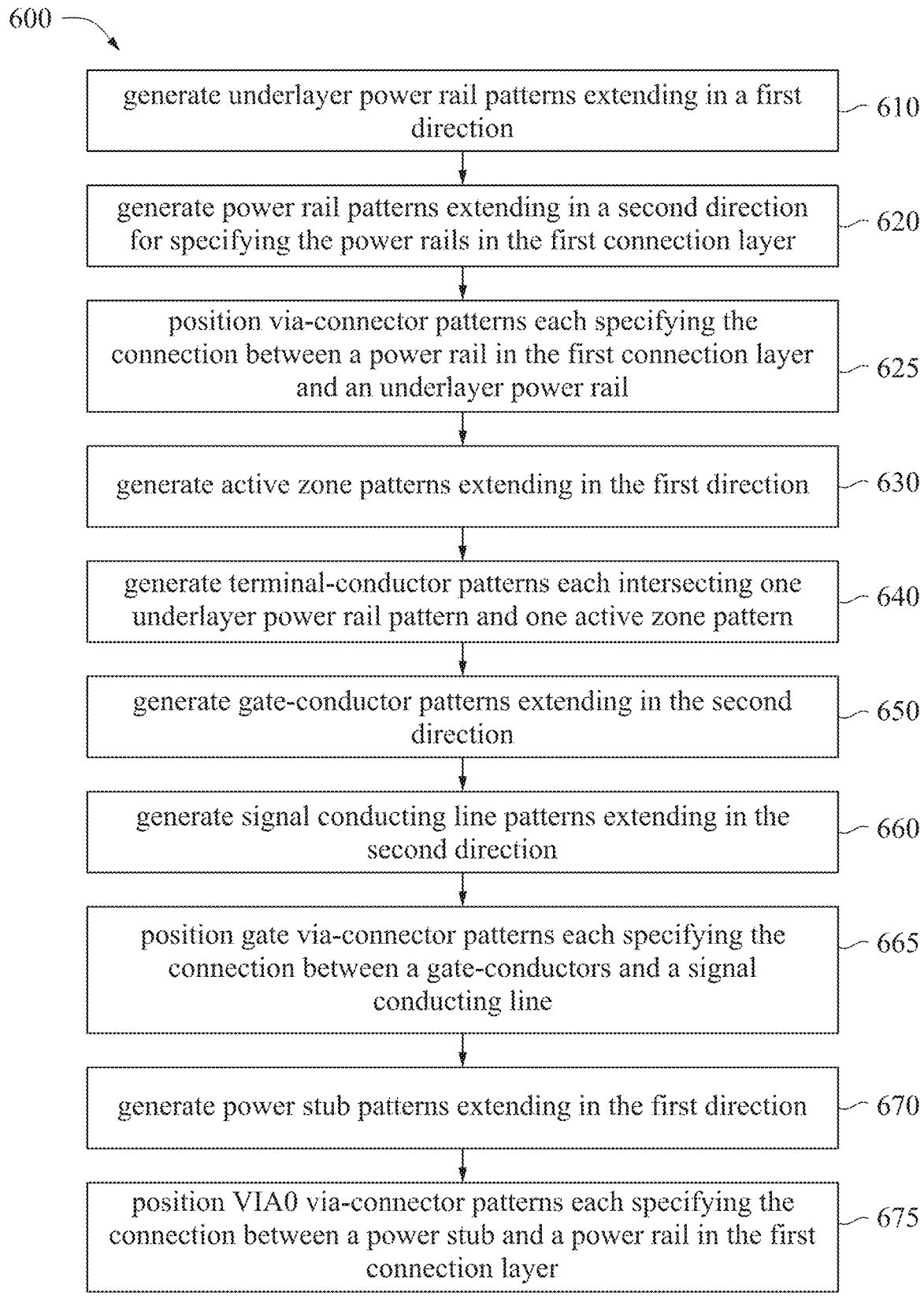
FIG. 6 is a flow chart of a method of generating a layout design of an integrated circuit by a processor, in accordance with some embodiments.

FIG. 6 is a flow chart of a method 600 of generating a layout design of an integrated circuit by a processor, in accordance with some embodiments. It is understood that additional operations may be performed before, during, and/or after the method 600 depicted in FIG. 6, and that some other processes may only be briefly described herein. In some embodiments, the method 600 is usable to generate one or more layout designs, such as the layout designs in FIG. 1, FIGS. 3A-3B, FIG. 4A, or FIG. 5A. In some embodiments, the method 600 is usable to form integrated circuits having similar structural relationships as among one or more of the elements in FIG. 1, FIGS. 2A-2C, FIGS. 3A-3B, FIG. 4A, or FIG. 5A. In some embodiments, method 600 is performed by a processing device (e.g., processor 1202 in FIG. 12) configured to execute instructions for generating one or more layout designs, such as the layout designs in FIG. 1, FIGS. 3A-3B, FIG. 4A, or FIG. 5A.

In operation 610 of method 600, underlayer power rail patterns extending in a first direction are generated. The underlayer power rail patterns generated include a first-voltage underlayer power rail pattern and a second-voltage underlayer power rail pattern. In the example layout designs of in FIG. 1, FIGS. 3A-3B, FIG. 4A, and FIG. 5A, the first-voltage underlayer power rail 40 extending in the X-direction is specified by a corresponding first-voltage underlayer power rail pattern, and the second-voltage underlayer power rail 20 extending in the X-direction is specified by a corresponding second-voltage underlayer power rail pattern. Both the first-voltage underlayer power rail 40 and the second-voltage underlayer power rail 20 are positioned below the first connection layer M0. After operation 610, the flow proceeds to operation 620.

In operation 620 of method 600, power rail patterns extending in a second direction are generated for specifying the power rails in the first connection layer. The power rail patterns generated include at least one first-voltage rail pattern and at least one second-voltage power rail pattern. In the example layout designs of FIG. 1, FIGS. 3A-3B, and FIG. 4A, each of the first-voltage power rails (such as, 52 and 58, and also 55 in FIGS. 3A and 54 in FIG. 4A) extending in the Y-direction is specified by a corresponding first-voltage power rail pattern, and the second-voltage power rails (such as, 32 and 38, and also 35 in FIG. 3A and 34 in FIG. 4A) extending in the Y-direction is specified by a corresponding second-voltage power rail pattern. Each of the first-voltage power rails and the second-voltage power rails are in the first connection layer M0. After operation 620, the flow proceeds to operation 625.

In operation 625 of method 600, via-connector patterns are positioned such that each via-connector pattern specifies the connection between a power rail in the first connection layer and an underlayer power rail. In the example layout designs of FIG. 1, FIGS. 3A-3B, and FIG. 4A, each connection between the first-voltage underlayer power rail 40 and one of the first-voltage power rails (such as, 52 and 58, and also 55 in FIGS. 3A-3B and 54 in FIG. 4A) is specified by a corresponding via-connector pattern (such as, V52 and V58, and also V55 in FIG. 3A and V54 in FIG. 4A). In the example layout designs of FIG. 1, FIGS. 3A-3B, and FIG. 4A, each connection between the second-voltage underlayer power rail 20 and one of the second-voltage power rails (such as, 32 and 38, and also 35 in FIG. 3A and 34 in FIG. 4A) is specified by a corresponding via-connector pattern (such as, V32 and V38, and also V35 in FIG. 3A and V34 in FIG. 4A). After operation 625, the flow proceeds to operation 630.

In operation 630 of method 600, active zone patterns extending in the first direction are generated. The active zone patterns generated include a first-type active zone pattern and a second-type active zone pattern. In the example layout designs of in FIG. 1, FIGS. 3A-3B, FIG. 4A, and FIG. 5A, the p-type active zone 80p extending in the X-direction is specified by a corresponding p-type active zone pattern, and the n-type active zone 80n extending in the X-direction is specified by a corresponding n-type active zone pattern. After operation 630, the flow proceeds to operation 640.

In operation 640 of method 600, terminal-conductor patterns are generated such that each terminal-conductor pattern intersects one underlayer power rail pattern and one active zone pattern. The terminal-conductor patterns generated includes a first terminal-conductor pattern intersecting the first-type active zone pattern and the first-voltage underlayer power rail pattern. The terminal-conductor patterns generated also includes a second terminal-conductor pattern intersecting the second-type active zone pattern and the second-voltage underlayer power rail pattern. For example, in the layout designs of FIG. 1 and FIGS. 3A-3B, the terminal-conductor pattern intersecting the layout pattern for the first-voltage underlayer power rail 40 and the layout pattern for the p-type active zone specifies the conductive connection between the terminal-conductor 172p and the first-voltage underlayer power rail 40. Also in the layout design of in FIG. 1 and FIGS. 3A-3B, the terminal-conductor pattern intersecting the layout pattern for the second-voltage underlayer power rail 20 and the layout pattern for the n-type active zone specifies the conductive connection between the terminal-conductor 172n and the second-voltage underlayer power rail 20. In some embodiments, additional terminal-conductor patterns are also generated before, during, or after operation 640. For example, in the layout designs of FIG. 1 and FIGS. 3A-3B, the additional terminal-conductor patterns include the layout pattern for terminal-conductor 178. After operation 640, the flow proceeds to operation 650.

In operation 650 of method 600, gate-conductor patterns extending in the second direction are generated. In the example layout designs of FIG. 1 and FIGS. 3A-3B, the gate-conductor 115 is specified by a corresponding gate-conductor pattern extending in the Y-direction. In the example layout design of FIG. 4A, each of the gate-conductors gB2, gB1, gA1, and gA2 is specified by a corresponding gate-conductor pattern extending in the Y-direction. In the example layout design of FIG. 5A, each of the gate-conductors gA1, gB1, gB2, and gA2 is specified by a corresponding gate-conductor pattern extending in the Y-direction. After operation 650, the flow proceeds to operation 660.

In operation 660 of method 600, signal conducting line patterns extending in the second direction are generated. In the example layout designs of FIG. 1 and FIG. 3A, the signal conducting line 155 is specified by a corresponding signal conducting line pattern extending in the Y-direction. In the example layout design of FIG. 3B, the signal conducting line 192 is specified by a corresponding signal conducting line pattern extending in the Y-direction. In the example layout designs of FIG. 4A, each of the signal conducting lines (492, 494, 495p, 495n, 496, 498, 454, 456, and 458) is specified by a corresponding signal conducting line pattern extending in the Y-direction. In the example layout designs of FIG. 5A, each of the signal conducting lines (551, 552p, 552n, 558p, 558n, and 559) is specified by a corresponding signal conducting line pattern extending in the Y-direction. After operation 650, the flow proceeds to operation 665.

In operation 665 of method 600, gate via-connector patterns are positioned such that each gate via-connector pattern specifies the connection between a gate-conductors and a signal conducting line. In the example layout designs of FIG. 1 and FIG. 3B, the gate via-connector pattern is generated to specify the gate via-connector VG for connecting the signal conducting line 155 with the gate-conductor 115. In the example layout design of FIG. 3A, the gate via-connector pattern is generated to specify the slot gate via-connector VSG for connecting the signal conducting line 195 with the gate-conductor 115. In the example layout design of FIG. 4A, the connections specified by the gate via-connector patterns include the connection between the gate-conductor gB2 and the signal conducting line 494, the connection between the gate-conductor gB1 and the signal conducting line 454, the connection between the gate-conductor gA1 and the signal conducting line 456, and the connection between the gate-conductor gA2 and the signal conducting line 458. In the example layout design of FIG. 5A, the connections specified by the gate via-connector patterns include the connection between the gate-conductor gA1 and the signal conducting line 552p, the connection between the gate-conductor gB1 and the signal conducting line 558p, the connection between the gate-conductor gB2 and the signal conducting line 552n, and the connection between the gate-conductor gA2 and the signal conducting line 558n. After operation 650, the flow proceeds to operation 670.

In operation 670 of method 600, power stub patterns extending in the first direction are generated. In some embodiments, each power stub pattern generated specifies a power stub in a second connection layer (such as the M1 layer) that is above the first connection layer (such as the M0 layer). After operation 670, in operation 675 of method 600, VIA0 via-connector patterns are positioned such that each VIA0 via-connector pattern specifies the connection between a power stub and a power rail in the first connection layer.

Figure 7A:
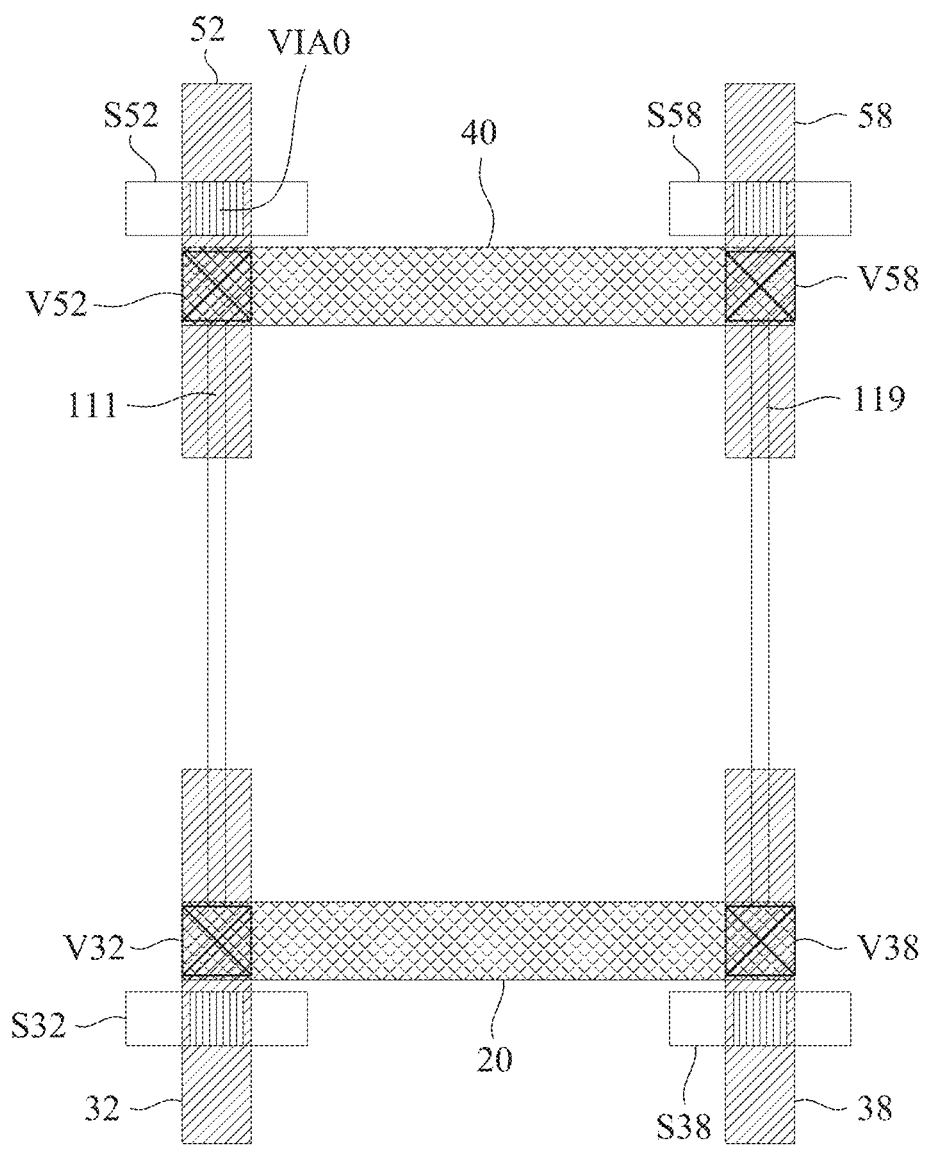
FIGS. 7A-7E are partial layout diagrams of various circuits, in accordance with some embodiments.

In some embodiments, in the example circuit cells as specified by the layout diagrams in FIG. 1, FIGS. 3A-3B, FIG. 4A, and FIG. 5A, each power rail is associated with at least one power stub. FIG. 7A is a partial layout diagram of the inverter circuit 100 in FIG. 1, in accordance with some embodiments. In FIG. 7A, for clarity of the presentation, only the power rail patterns and the underlayer power rail patterns in FIG. 1 are retained along with the associated via-connector patterns, and additionally, power stub patterns are included. As specified by the partial layout diagram of FIG. 7A, the first-voltage power rails 52 and 58 are correspondingly connected to the power stubs S52 and S58 through the VIA0 via-connectors at the corresponding intersections, and the second-voltage power rails 32 and 38 are also correspondingly connected to the power stubs S32 and S38 through the VIA0 via-connectors at the corresponding intersections.

Figure 7B:
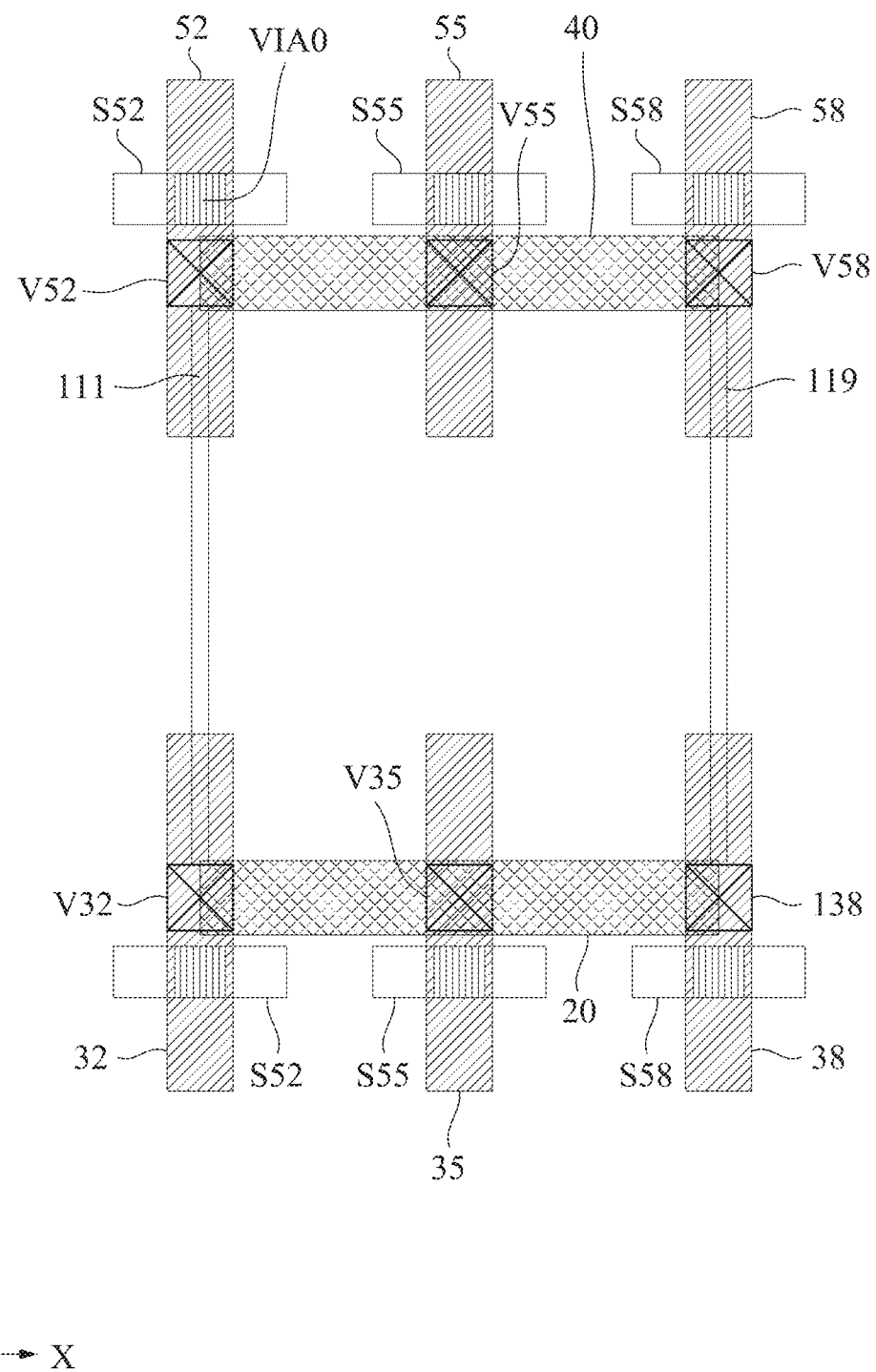

FIG. 7B is a partial layout diagram of the inverter circuit 300 in FIG. 3A, in accordance with some embodiments. In FIG. 7B, for clarity of presentation, only the power rail patterns and the underlayer power rail patterns in FIG. 3A are retained along with the associated via-connector patterns, and additionally, power stub patterns are included. As specified by the partial layout diagram of FIG. 7B, the first-voltage power rails (52, 55, and 58) are correspondingly connected to the power stubs (S52, S55, and S58) through the VIA0 via-connectors at the corresponding intersections, and the second-voltage power rails (32, 35, and 38) are also correspondingly connected to the power stubs (S32, S35, and S38) through the VIA0 via-connectors at the corresponding intersections.

Figure 7C:
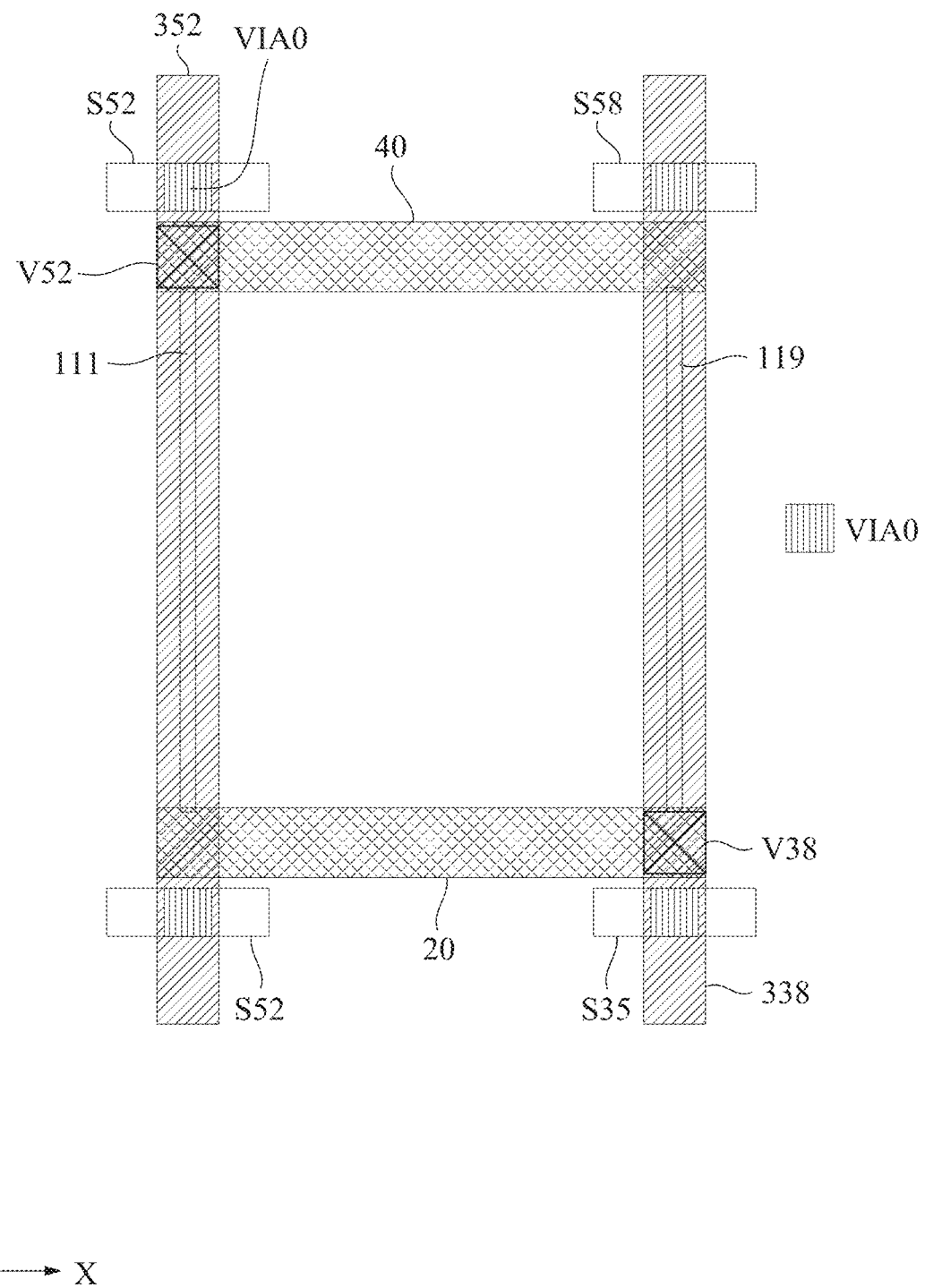

FIG. 7C is a partial layout diagram of the inverter circuit 100B in FIG. 3B, in accordance with some embodiments. In FIG. 7C, for clarity of the presentation, only the power rail patterns and the underlayer power rail patterns in FIG. 3B are retained along with the associated via-connector patterns, and additionally, power stub patterns are included. As specified by the partial layout diagram of FIG. 7C, the first-voltage power rail 352 is connected to the power stubs S52 and S352 through the VIA0 via-connectors at the corresponding intersection, and the second-voltage power rail 332 is connected to the power stubs S32 and S332 through the VIA0 via-connectors at the corresponding intersection.

Figure 7D:
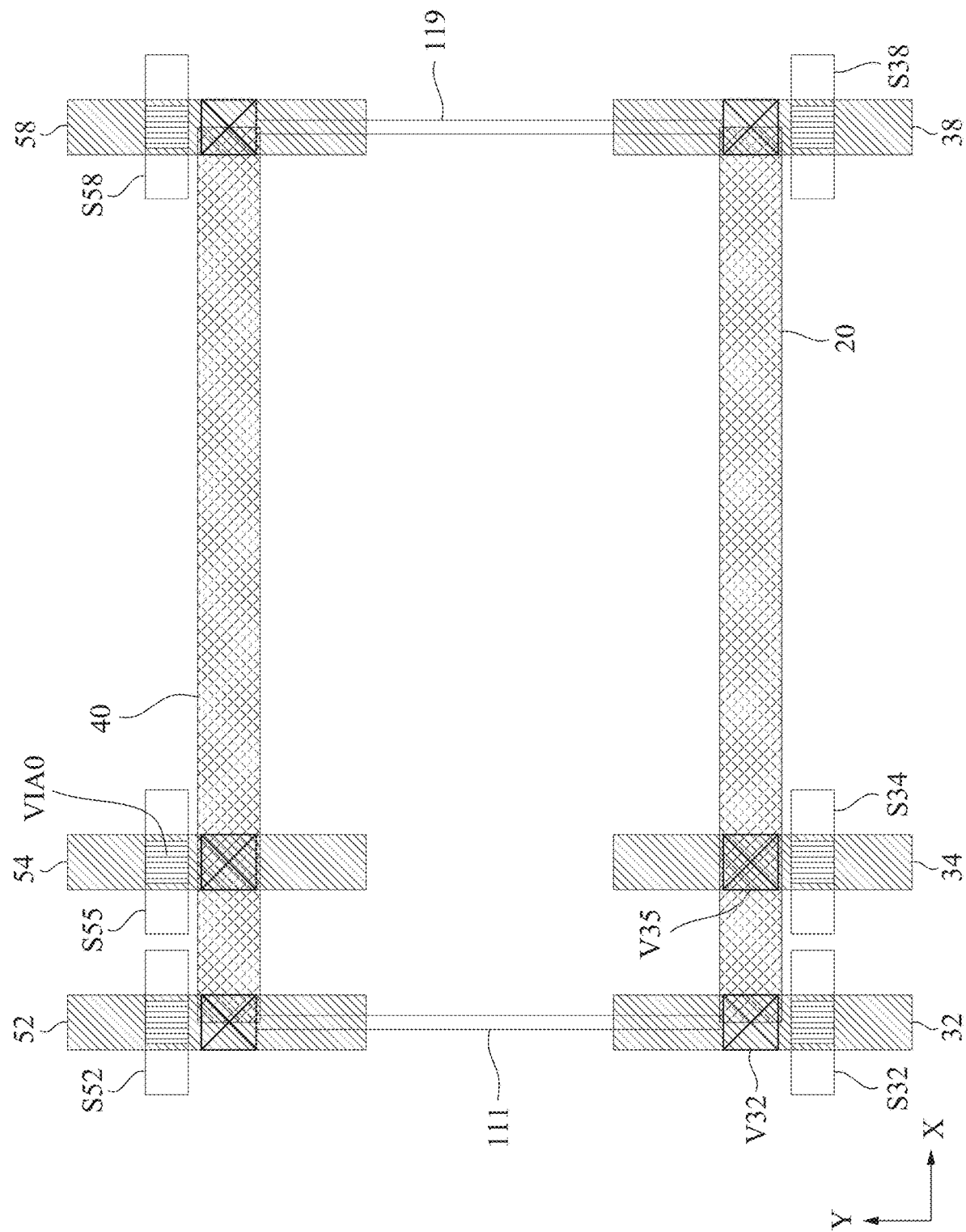

FIG. 7D is a partial layout diagram of the AOI logic circuit 400 in FIG. 4A, in accordance with some embodiments. In FIG. 7D, for clarity of presentation, only the power rail patterns and the underlayer power rail patterns in FIG. 4A are retained along with the associated via-connector patterns, and additionally, power stub patterns are included. As specified by the partial layout diagram of FIG. 7D, the first-voltage power rails (52, 55, and 58) are correspondingly connected to the power stubs (S52, S54, and S58) through the VIA0 via-connectors at the corresponding intersections, and the second-voltage power rails (32, 35, and 38) are also correspondingly connected to the power stubs (S32, S34, and S38) through the VIA0 via-connectors at the corresponding intersections.

Figure 7E:
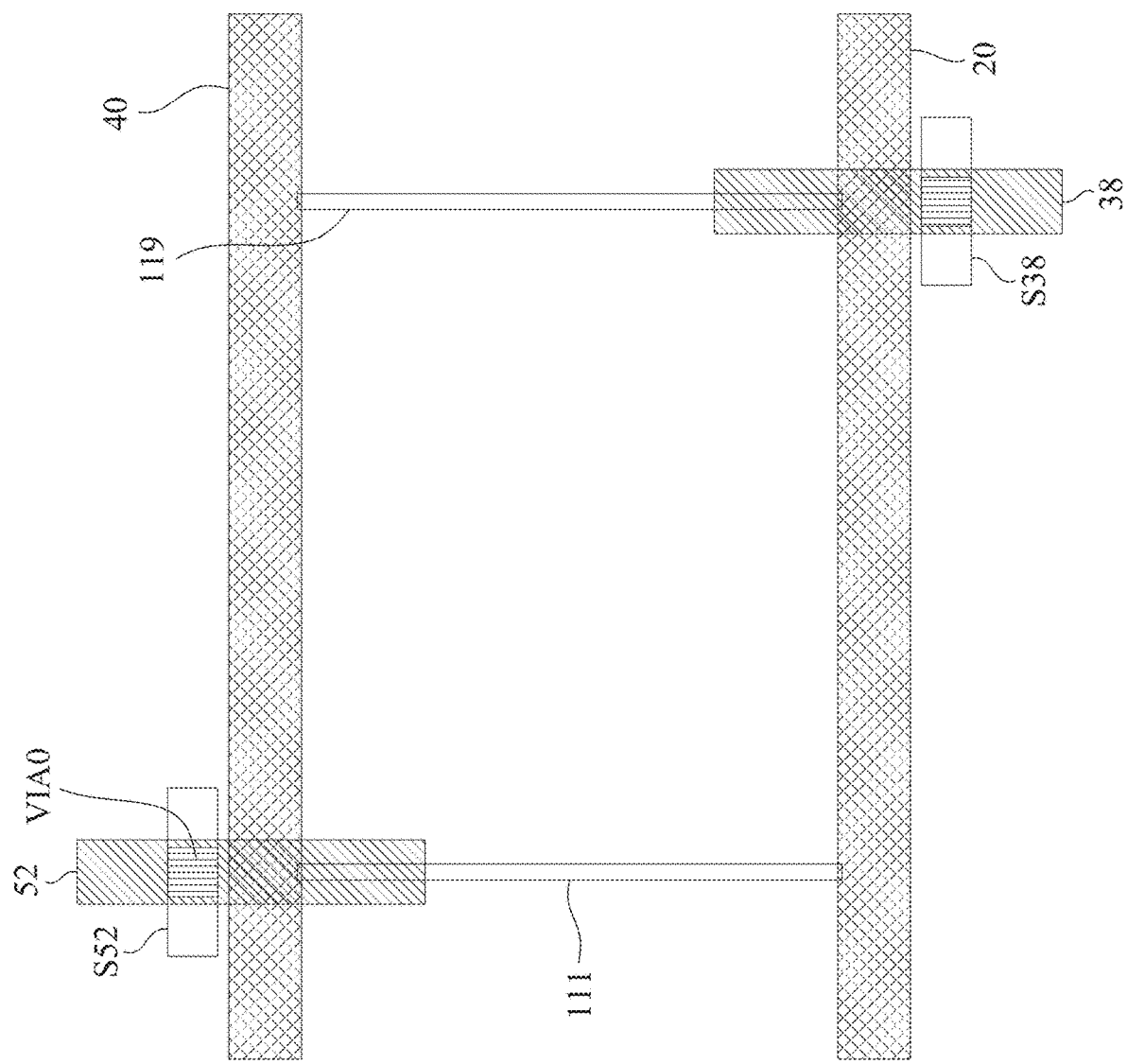

FIG. 7E is a partial layout diagram of the transmission gate circuit 500 in FIG. 5A, in accordance with some embodiments. In FIG. 7E, for clarity of the presentation, only the power rail patterns and the underlayer power rail patterns in FIG. 5A are retained along with the associated via-connector patterns, and additionally, power stub patterns are included. As specified by the partial layout diagram of FIG. 7E, the first-voltage power rails 52 is connected to the power stub S52 through the VIA0 via-connector at the corresponding intersection, and the second-voltage power rail 38 is also connected to the power stub S38 through the VIA0 via-connector at the corresponding intersection.

Figure 8:
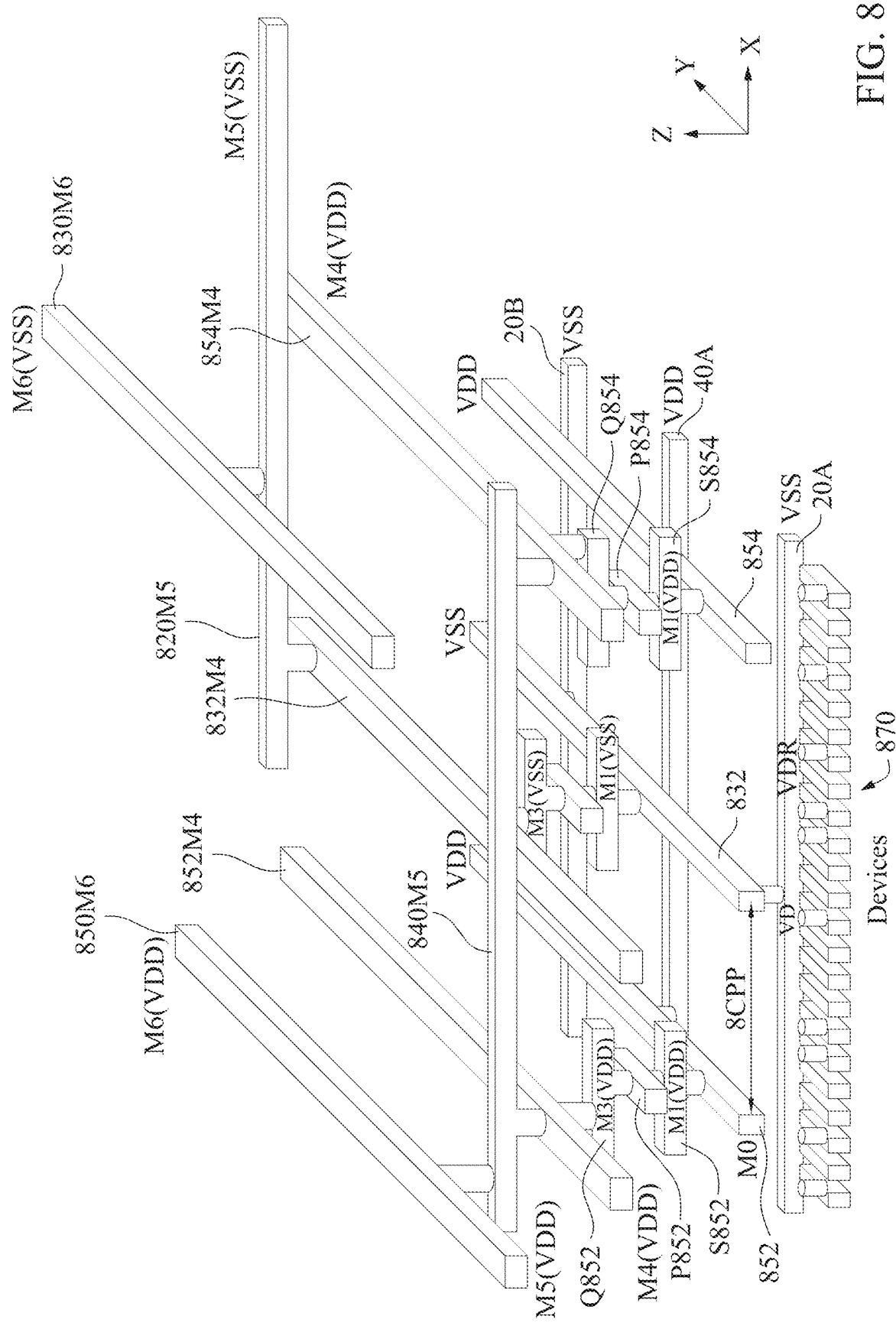
FIG. 8 is a three-dimensional schematic drawing of the power distribution connections for an integrated circuit having underlayer power rails, in accordance with some embodiments.

FIG. 8 is a three-dimensional schematic drawing of the power distribution connections for an integrated circuit having underlayer power rails, in accordance with some embodiments. In FIG. 8, the first supply voltage (such as VDD) for the integrated circuit is provided by the first-voltage underlayer power rail (such as 40A), and the second supply voltage (such as VSS) for the integrated circuit is provided by the second-voltage underlayer power rail (such as 20A or 20B). For example, the second-voltage underlayer power rail 20A crosses over an array of terminal-conductors 870, and some of the terminal-conductors (while functioning as the source terminals of the n-type transistors) are conductively connected to the second-voltage underlayer power rail 20A through the terminal via-connectors VD. In FIG. 8, the first-voltage underlayer power rail 40A is conductively connected to the first-voltage power rails 852 and 854 through the corresponding via-connectors under the first-voltage power rails, and each of the second-voltage underlayer power rails 20A and 20B is conductively connected to the second-voltage power rail 832 through the corresponding via-connector under the second-voltage power rail. The first-voltage power rails 852 and 854 and the second-voltage power rail 832 are all in the first connection layer M0.

In FIG. 8, each of the first-voltage power rails 852 and 854 is conductively connected to a corresponding one of the first-voltage power stubs S852 and S854 through the via-connector VIA0, and the second-voltage power rail 832 is conductively connected to the power stub S832 through the via-connector VIA0. Each of the power stubs S852, S832 and S854 extends in the X-direction and is in the second connection layer M1.

In FIG. 8, each of the first-voltage power stubs S852 and S854 is conductively connected to a corresponding one of the first-voltage power stubs P852 and P854 (extending in the Y-direction) through the via-connector VIA1, and the second-voltage power stub S832 is conductively connected to the second-voltage power stub P832 (extending in the Y-direction) through the via-connector VIA1. The power stubs P852, P832 and P854 are in the third connection layer M2 which is above in the second connection layer M1.

In FIG. 8, each of the first-voltage power stubs P852 and P854 in the third connection layer is conductively connected to a corresponding one of the first-voltage power stubs Q852 and Q854 (extending in the X-direction) through the via-connector VIA2, and the second-voltage power stub P832 in the third connection layer is conductively connected to the second-voltage power stub Q832 (extending in the X-direction) through the via-connector VIA2. The power stubs Q852, Q832 and Q854 are in the fourth connection layer M3 which is above the third connection layer M2.

In FIG. 8, each of the first-voltage power stubs Q852 and Q854 in the fourth connection layer is conductively connected to a corresponding one of the fifth-connection-layer power rails 852M4 and 854M4 (extending in the Y-direction) through the via-connector VIA3, and the second-voltage power stub Q832 in the fourth connection layer is conductively connected to the fifth-connection-layer power rails 832M4 (extending in the Y-direction) through the via-connector VIA3. The fifth-connection-layer power rails 852M4, 832M4, and 854M4 are in the fifth connection layer M4 which is above in the fourth connection layer M3.

In FIG. 8, each of the fifth-connection-layer power rail 852M4 and 854M4 is conductively connected to the sixth-connection-layer power rail 840M5 (extending in the X-direction) through the via-connector VIA4, and the sixth-connection-layer power rail 840M5 is conductively connected to the seventh-connection-layer power rail 850M6 (extending in the Y-direction) through the via-connector VIA5. The fifth-connection-layer power rail 832M4 is conductively connected to the sixth-connection-layer power rail 820M5 (extending in the X-direction) through the via-connector VIA4, and the sixth-connection-layer power rail 820M5 is conductively connected to the seventh-connection-layer power rail 830M6 (extending in the Y-direction) through the via-connector VIA5.

Figure 9A:
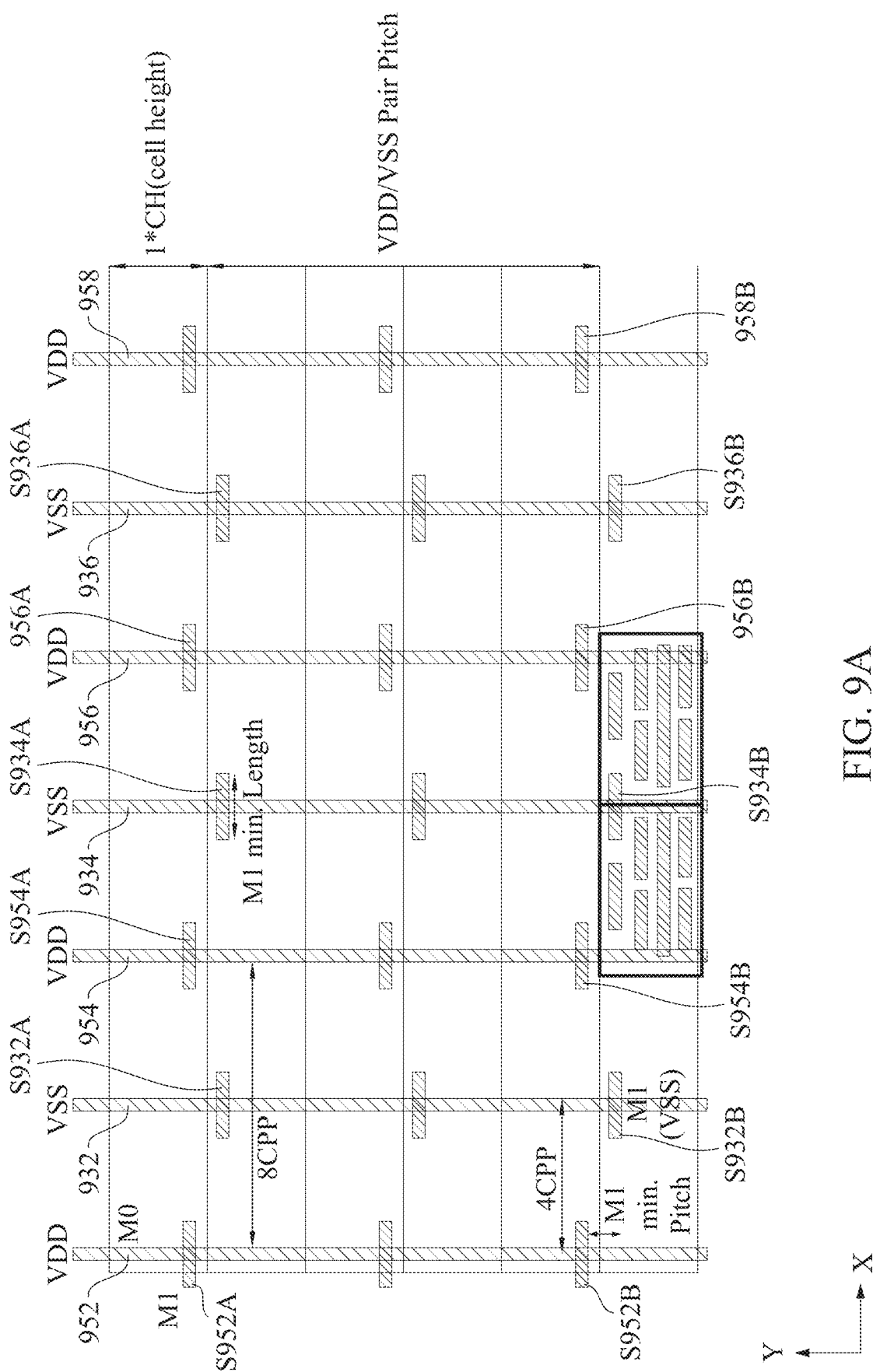
FIGS. 9A-9B are schematic drawings of the power distribution connections between the power rails and the power stubs, in accordance with some embodiments.
Figure 9B:
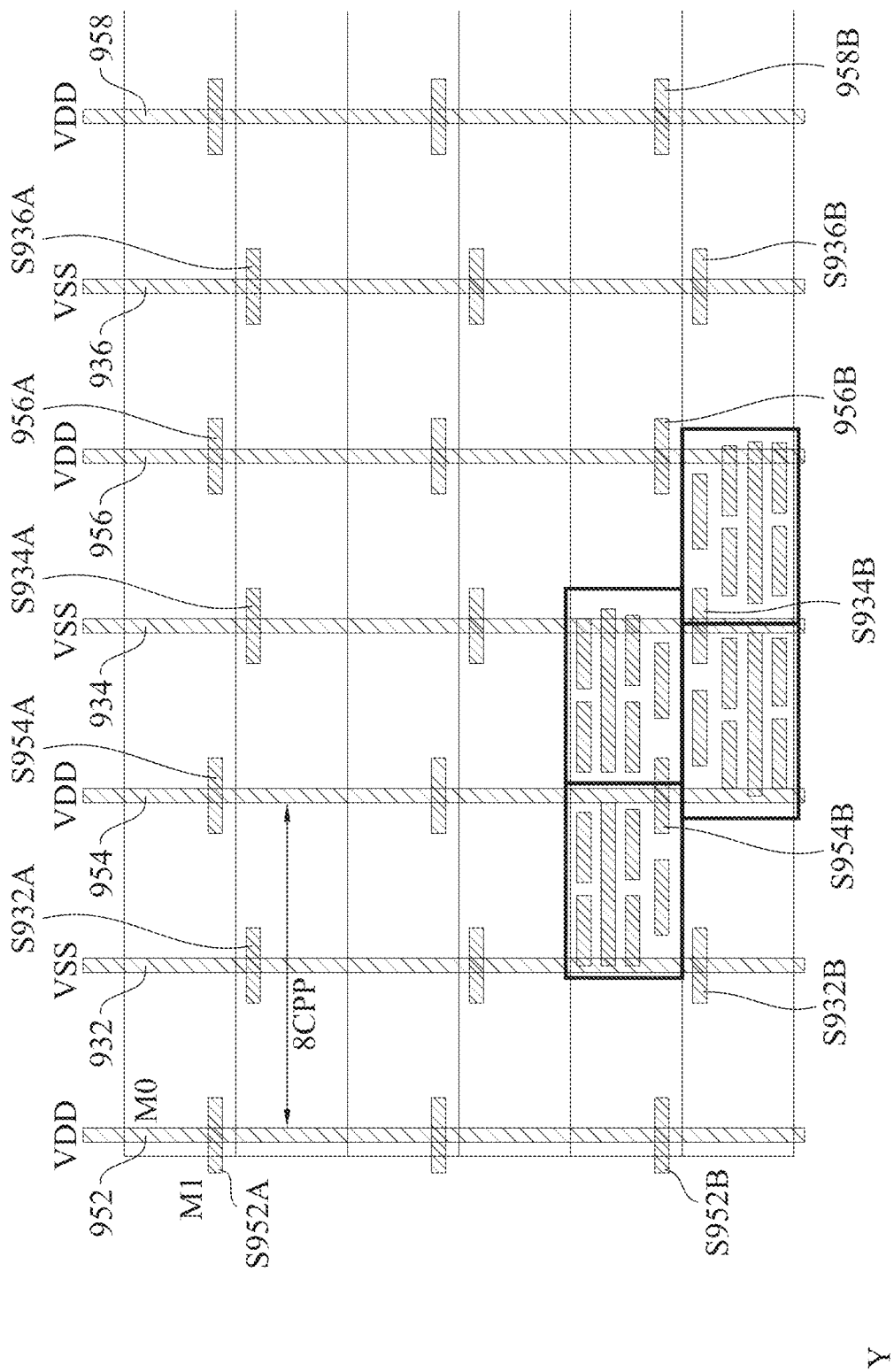

FIGS. 9A-9B are schematic drawings of the power distribution connections between the power rails in the first connection layer and the power stubs in the second connection layer, in accordance with some embodiments. In FIGS. 9A-9B, the first-voltage power rails 952, 954, 956, and 958 in the first connection layer M0 are all extending in the Y-direction, and the second-voltage power rails 932, 934, and 936 in the first connection layer M0 are all extending in the X-direction. The pitch distance along the X-direction between two first-voltage power rails is 8.0 CPP, and the pitch distance along the X-direction between two second-voltage power rails is also 8.0 CPP. The first-voltage power rails and the second-voltage power rails are positioned near the boundaries of the cells. For example, in some embodiments, each of the first-voltage power rails and the second-voltage power rails has a center line that is on a vertical boundary or near the vertical boundary (or displaced along the X-direction from the vertical boundary with a displacement less than 0.25 CPP, for the purpose of interpreting the meaning of near the vertical boundary).

In FIG. 9A, each first-voltage power rail (952, 954, 956, or 958) is conductively connected to at least two corresponding first-voltage power stubs (S952A-S952B, S954A-S954B, S956A-S956B, or S958A-S958B) at the corresponding intersections, and each second-voltage power rail (932, 934, or 936) is conductively connected to at least two corresponding second-voltage power stubs (S932A-S932B, S934A-S934B, or S936A-S936B) at the corresponding intersections. In FIG. 9B, each first-voltage power rail (952, 954, 956, or 958) is conductively connected to at least three corresponding first-voltage power stubs (S952A-S952C, S954A-S954C, S956A-S956C, or S958A-S958C) at the corresponding intersections, and each second-voltage power rail (932, 934, or 936) is conductively connected to at least three corresponding second-voltage power stubs (S932A-S932C, S934A-S934C, or S936A-S936C) at the corresponding intersections. In FIGS. 9A-9B, the first-voltage power stubs and the second-voltage power stubs are in the second connection layer M1. Each of the first-voltage power stubs and the second-voltage power stubs extends in the X-direction and has a length in a range from 2.0 CPP to 3.0 CPP. Each row of the first-voltage power stubs (e.g., 952B) is displaced along the Y-direction from another row of the second-voltage power stubs (e.g., 932B), and the displacement distance along the Y-direction between the two rows is larger than or equal to the minimal pitch distance between two metal lines in the second connection layer M1. The first-voltage power stubs and the second-voltage power stubs are near the boundaries of the cells. For example, in some embodiments, each of the first-voltage power stubs and the second-voltage power stubs has a center point on a vertical cell boundary or near the vertical cell boundary (or displaced along the X-direction from the vertical cell boundary with a displacement less than 0.25 CPP, for the purpose of interpreting the meaning of near the vertical cell boundary).

In FIG. 9A, the pitch distance along the Y-direction between two first-voltage power stubs (e.g., between S952A and S952B) crossing a same first-voltage power rail (e.g., 952) is four times the cell height, and the pitch distance along the Y-direction between two second-voltage power stubs (e.g., between S932A and S932B) crossing a same second-voltage power rail (e.g., 952) is also four times the cell height. In FIG. 9B the pitch distance along the Y-direction between two first-voltage power stubs (e.g., between S952A and S952B, or between S952B and S952C) crossing a same first-voltage power rail (e.g., 952) is two times the cell height, and the pitch distance along the Y-direction between two second-voltage power stubs (e.g., between S932A and S932B, or between S932B and S932C) crossing a same second-voltage power rail (e.g., 952) is also two times the cell height.

Figure 10:
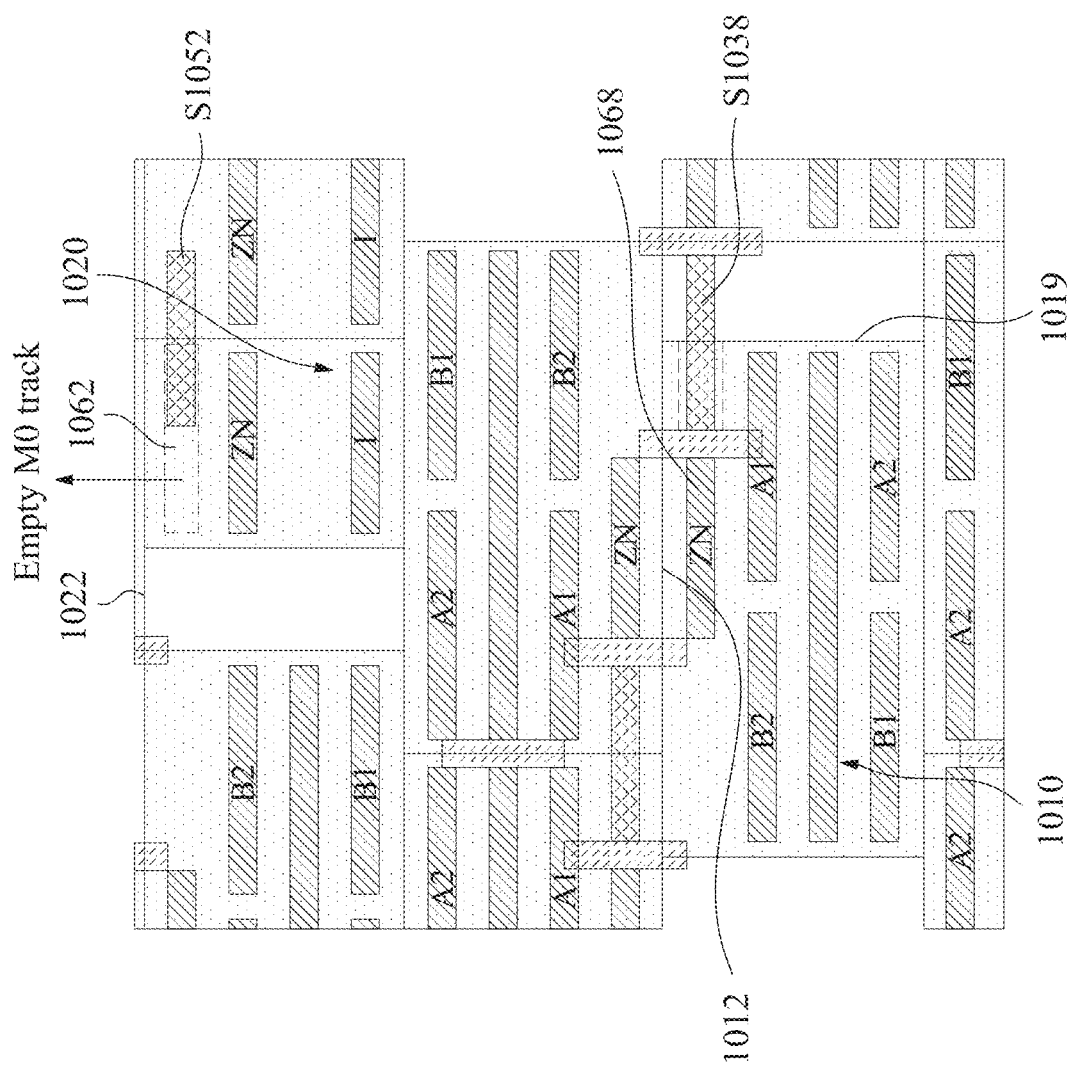
FIG. 10 is a schematic drawing of a layout plan of power stubs in the second connection layer, in accordance with some embodiments.

FIG. 10 is a schematic drawing of a layout plan of power stubs in the second connection layer, in accordance with some embodiments. In FIG. 10, the power stub S1038 intersects a vertical boundary of a cell 1010, and the power stub S1052 intersects a vertical boundary of a cell 1020. In some embodiments, power stubs in the second connection layer M1 are near the horizontal cell boundaries. For example, in FIG. 10, the power stub S1038 is aligned in the same signal track as the output pin 1068 adjacent to the horizontal boundary 1012 of the cell 1010, and the power stub S1052 is aligned with an empty track 1062 adjacent to the horizontal boundary 1022 of the cell 1020. Additionally, each pin (such as the output pin 1068) sharing a same signal track with a power stub (such as the power stub S1038) generally has at least 1.5 CPP separation distance between the pin and the nearest vertical cell boundary (such as the boundary 1019).

Figure 11:
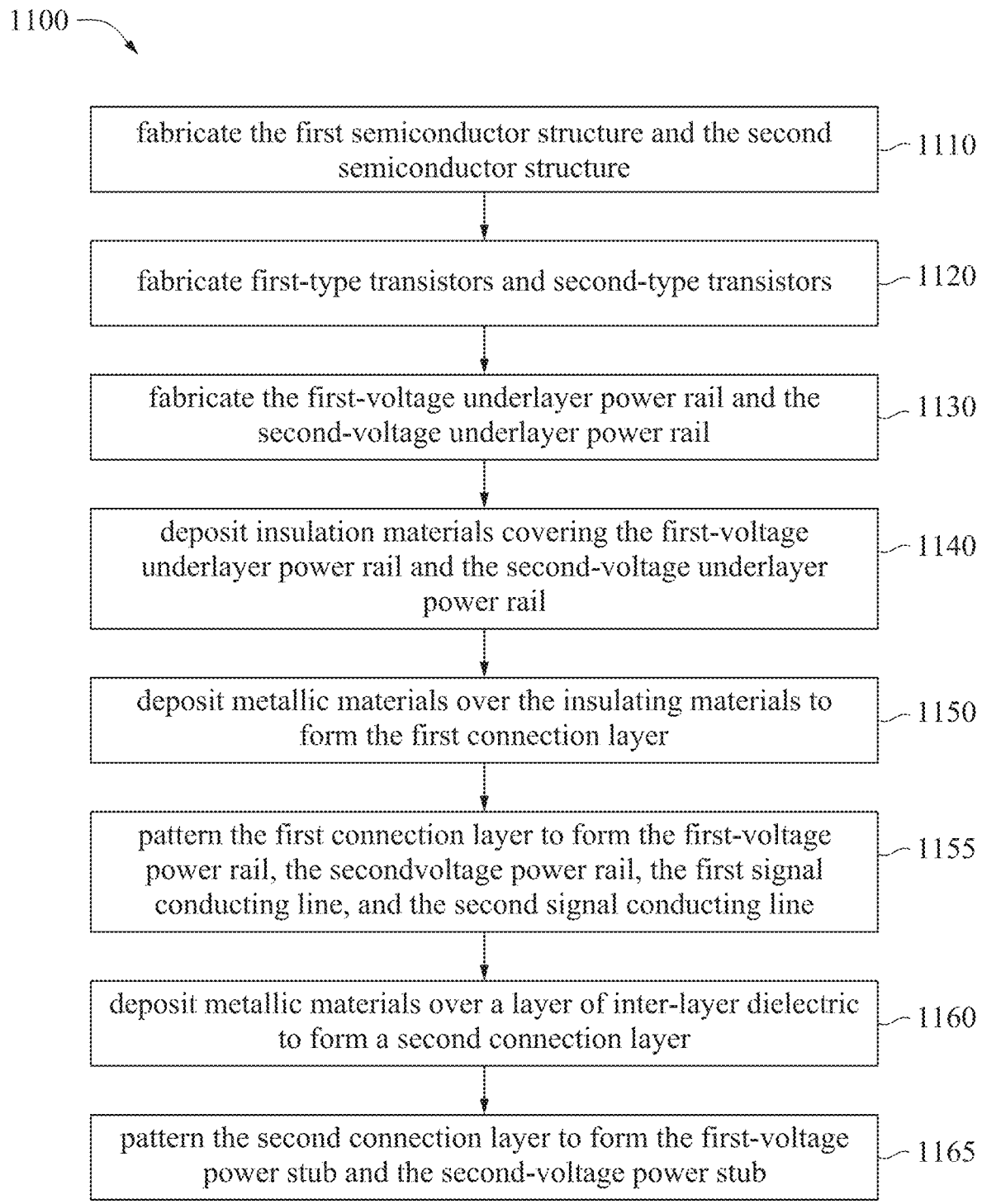
FIG. 11 is a flow chart of a method of fabricating an integrated circuit having underlayer power rails, in accordance with some embodiments.

FIG. 11 is a flow chart of a method 1100 of fabricating an integrated circuit having underlayer power rails, in accordance with some embodiments. It is understood that additional operations may be performed before, during, and/or after the method 1100 depicted in FIG. 11. In some embodiments, the method 1100 is usable in the manufacture processes for fabricating one or more integrated circuits, such as the integrated circuits as specified by the layout designs in FIG. 1, FIGS. 3A-3B, FIG. 4A, or FIG. 5A. In some embodiments, the method 1100 is usable in the manufacture processes for fabricating one or more integrated circuits having similar structural relationships as among one or more of the elements in FIG. 1, FIGS. 2A-2C, FIGS. 3A-3B, FIG. 4A, or FIG. 5A.

In operation 1110 of method 1100, the first semiconductor structure and the second semiconductor structure are fabricated. In some embodiments, the first semiconductor structure is fabricated for supporting one or more p-type transistors, and the second semiconductor structure is fabricated for supporting one or more n-type transistors. In some embodiments, the first semiconductor structure is fabricated for supporting one or more n-type transistors, and the second semiconductor structure is fabricated for supporting one or more p-type transistors. In some embodiments, the semiconductor structures are fabricated as fin structures. In some embodiments, the semiconductor structures are fabricated as nano-sheet structures. In some embodiments, the semiconductor structures are fabricated as nano-wire structures. As a non-limiting example, in FIGS. 2A-2C, the semiconductor structure 180$p$ for supporting the p-type transistor T1$p$ (which is identified in FIG. 1) and the semiconductor structure 180$n$ for supporting the n-type transistor T1$n$ (which is identified in FIG. 1) are fabricated as nano-sheet structures.

In operation 1120 of method 1100, first-type transistors and second-type transistors are fabricated. The fabrication of first-type transistors includes the fabrication of the gate-conductors intersecting the first semiconductor structure at channel regions of the first-type transistors. The fabrication of second-type transistors includes the fabrication of the gate-conductors intersecting the second semiconductor structure at channel regions of the second-type transistors. In some embodiments, the fabrication of first-type transistors also includes the fabrication of the terminal-conductors intersecting the first semiconductor structure at source/drain regions of the first-type transistors. In some embodiments, the fabrication of second-type transistors also includes the fabrication of the terminal-conductors intersecting the second semiconductor structure at source/drain regions of the second-type transistors. In the non-limiting examples of FIG. 2A and FIG. 2B, the terminal-conductors 172$p$, 172$n$, and 178 are fabricated in operation 1120 when the p-type transistor T1$p$ and the n-type transistor T1$n$ are fabricated. In FIG. 2A, the terminal-conductor 172$p$ intersects the semiconductor structure 180$p$ at the source region sT1$p$ of the p-type transistor T1$p$, and the terminal-conductor 172$n$ intersects the n-type first semiconductor structure 180$n$ at the source region sT1$n$ of the n-type transistor T1$n$. In FIG. 2B, the terminal-conductor 178 intersects the semiconductor structure 180$p$ at the drain region dT1$p$ of the p-type transistor T1$p$ and intersects the semiconductor structure 180$n$ at the drain region dT1$n$ of the n-type transistor T1$n$.

In operation 1130 of method 1100, the first-voltage underlayer power rail and the second-voltage underlayer power rail are fabricated. The first-voltage underlayer power rail is conductively connecting to the source region of the first-type transistor. The second-voltage underlayer power rail is conductively connecting to the source region of the second-type transistor. In the non-limiting examples of FIGS. 2A-2C, the first-voltage underlayer power rail 40 and the second-voltage underlayer power rail 20 are fabricated above the semiconductor structure 180$p$ and the semiconductor structure 180$n$. In FIG. 2A, the first-voltage underlayer power rail 40 is conductively connected to the terminal-conductor 172$p$, and the second-voltage underlayer power rail 20 is conductively connected to the terminal-conductor 172$n$.

In operation 1140 of method 1100, an insulating material is deposited covering the first-voltage underlayer power rail, the second-voltage underlayer power rail. In the non-limiting examples of FIGS. 2A-2C, the insulating material 210 are deposited covering the first-voltage underlayer power rail 40 and the second-voltage underlayer power rail 20.

In operation 1150 of method 1100, metals are deposited over the insulating material to form the first connection layer. Then, in operation 1155 of method 1100, the first connection layer is patterned to form the first-voltage power rail, the second-voltage power rail, the first signal conducting line, and the second signal conducting line. The first-voltage power rail is directly connected with the first-voltage underlayer power rail through a first via-connector and the second-voltage power rail is directly connected with the second-voltage underlayer power rail through a second via-connector. The first signal conducting line is directly connected with the gate-conductor through a gate via-connector. In the non-limiting examples of FIGS. 2A-2C, metals are deposited over the insulating material 210 to form the first connection layer M0. The signal conducting line 198 in FIG. 2B, the first-voltage power rail 58 in FIG. 2C, and the second-voltage power rail 38 in FIG. 2C are all formed in operation 1155 by patterning the first connection layer M0. In FIG. 2B, the signal conducting line 198 is conductively connected to the terminal-conductor 178 through the terminal via-connector VD. In FIG. 2C, The first-voltage power rail 58 is directly connected with the first-voltage underlayer power rail 40 through the via-connector V58, and the second-voltage power rail 38 is directly connected with the second-voltage underlayer power rail 20 through the via-connector V38.

In operation 1160 of method 1100, metals are deposited over a layer of inter-layer dielectric to form a second connection layer. In operation 1165 of method 1100, the second connection layer are patterned to form the first-voltage power stub and the second-voltage power stub. In the non-limiting examples of FIG. 8, the first-voltage power rails (852 and 854) and the second-voltage power rail 832 are all formed in operation 1155 by patterning the first connection layer M0. Each of the first-voltage power rails (852 and 854) is directly connected with the first-voltage underlayer power rail 40A. The second-voltage power rail 832 is directly connected with the second-voltage underlayer power rails 20A and 20B. The first-voltage power stubs (S852 and S854) and the second-voltage power stub (S832) are all formed in operation 1165 by patterning the second connection layer M1. The second connection layer M1 is above the first connection layer M0 and separated from interlayer dielectric (ILD) materials (not shown in FIG. 8).

Figure 12:
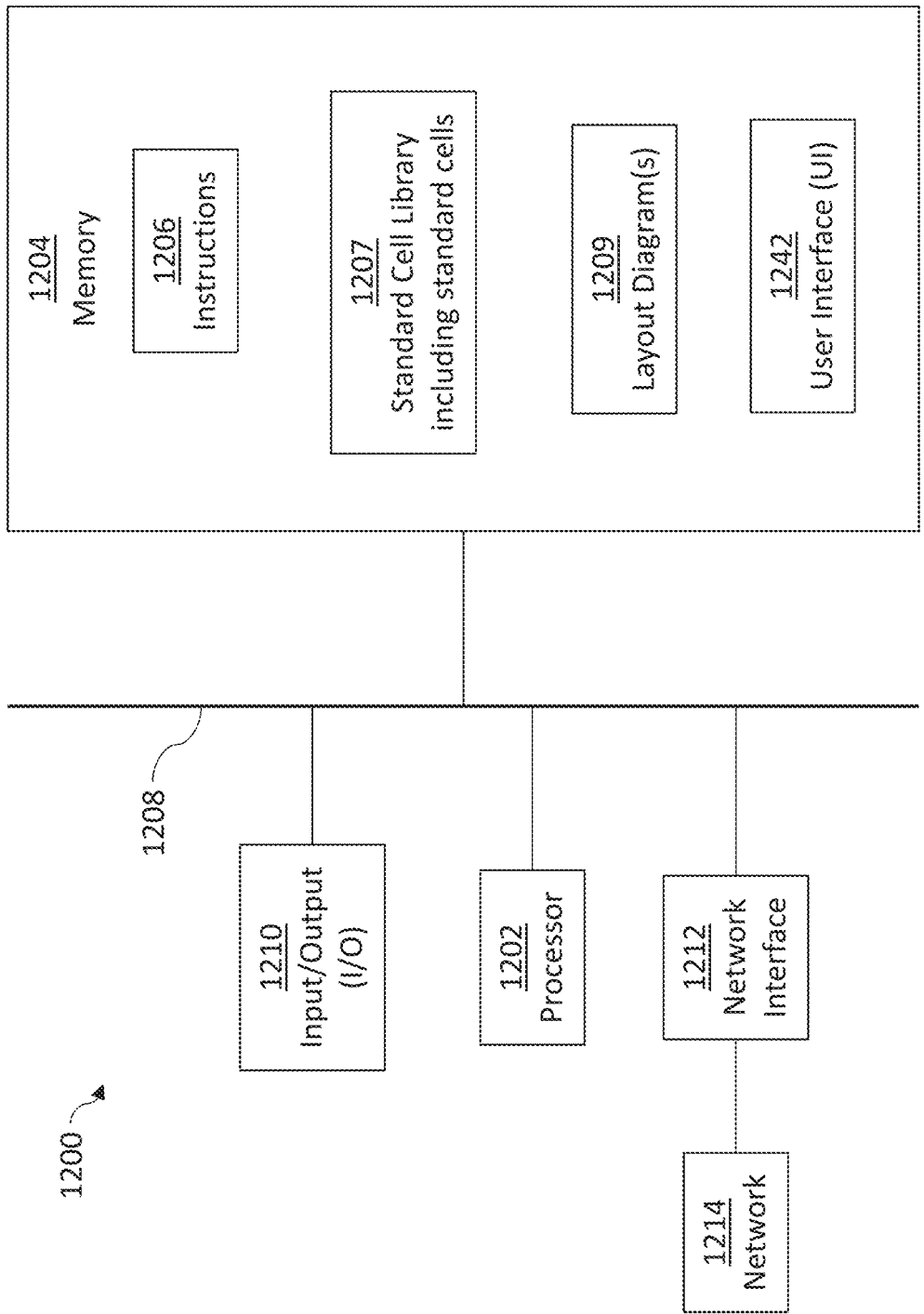
FIG. 12 is a block diagram of an electronic design automation (EDA) system in accordance with some embodiments.

FIG. 12 is a block diagram of an electronic design automation (EDA) system 1200 in accordance with some embodiments.

In some embodiments, EDA system 1200 includes an APR system. Methods described herein of designing layout diagrams represent wire routing arrangements, in accordance with one or more embodiments, are implementable, for example, using EDA system 1200, in accordance with some embodiments.

In some embodiments, EDA system 1200 is a general purpose computing device including a hardware processor 1202 and a non-transitory, computer-readable storage medium 1204. Storage medium 1204, amongst other things, is encoded with, i.e., stores, computer program code 1206, i.e., a set of executable instructions. Execution of instructions 1206 by hardware processor 1202 represents (at least in part) an EDA tool which implements a portion or all of the methods described herein in accordance with one or more embodiments (hereinafter, the noted processes and/or methods).

Processor 1202 is electrically coupled to computer-readable storage medium 1204 via a bus 1208. Processor 1202 is also electrically coupled to an I/O interface 1210 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. Processor 1202 is configured to execute computer program code 1206 encoded in computer-readable storage medium 1204 in order to cause system 1200 to be usable for performing a portion or all of the noted processes and/or methods. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, storage medium 1204 stores computer program code 1206 configured to cause system 1200 (where such execution represents (at least in part) the EDA tool) to be usable for performing a portion or all of the noted processes and/or methods. In one or more embodiments, storage medium 1204 also stores information which facilitates performing a portion or all of the noted processes and/or methods. In one or more embodiments, storage medium 1204 stores library 1207 of standard cells including such standard cells as disclosed herein. In one or more embodiments, storage medium 1204 stores one or more layout diagrams 1209 corresponding to one or more layouts disclosed herein.

EDA system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

EDA system 1200 also includes network interface 1212 coupled to processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1200.

System 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. EDA system 1200 is configured to receive information related to a UI through I/O interface 1210. The information is stored in computer-readable medium 1204 as user interface (UI) 1242.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1200. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 13:
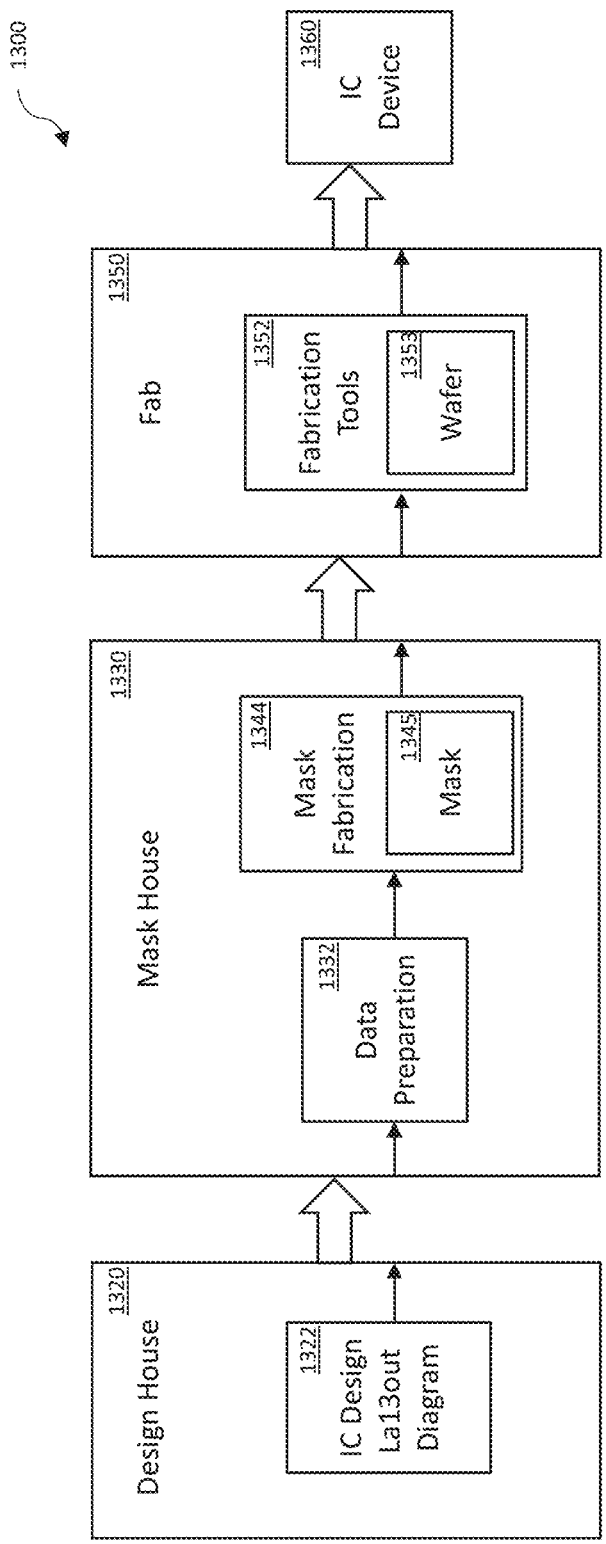
FIG. 13 is a block diagram of an integrated circuit (IC) manufacturing system, and an IC manufacturing flow associated therewith, in accordance with some embodiments.

FIG. 13 is a block diagram of an integrated circuit (IC) manufacturing system 1300, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1300.

In FIG. 13, IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1350 is owned by a single larger company. In some embodiments, two or more of design house 1320, mask house 1330, and IC fab 1350 coexist in a common facility and use common resources.

Design house (or design team) 1320 generates an IC design layout diagram 1322. IC design layout diagram 1322 includes various geometrical patterns designed for an IC device 1360. The geometrical patterns correspond to patterns of metal, oxide, or semiconductor layers that make up the various components of IC device 1360 to be fabricated. The various layers combine to form various IC features. For example, a portion of IC design layout diagram 1322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1320 implements a proper design procedure to form IC design layout diagram 1322. The design procedure includes one or more of logic design, physical design or place and route. IC design layout diagram 1322 is presented in one or more data files having information of the geometrical patterns. For example, IC design layout diagram 1322 can be expressed in a GDSII file format or DFII file format.

Mask house 1330 includes data preparation 1332 and mask fabrication 1344. Mask house 1330 uses IC design layout diagram 1322 to manufacture one or more masks 1345 to be used for fabricating the various layers of IC device 1360 according to IC design layout diagram 1322. Mask house 1330 performs mask data preparation 1332, where IC design layout diagram 1322 is translated into a representative data file ("RDF"). Mask data preparation 1332 provides the RDF to mask fabrication 1344. Mask fabrication 1344 includes a mask writer. A mask writer converts the RDF to an image on a substrate, such as a mask (reticle) 1345 or a semiconductor wafer 1353. The design layout diagram 1322 is manipulated by mask data preparation 1332 to comply with particular characteristics of the mask writer and/or requirements of IC fab 1350. In FIG. 13, mask data preparation 1332 and mask fabrication 1344 are illustrated as separate elements. In some embodiments, mask data preparation 1332 and mask fabrication 1344 can be collectively referred to as mask data preparation.

In some embodiments, mask data preparation 1332 includes optical proximity correction (OPC) which uses lithography enhancement techniques to compensate for image errors, such as those that can arise from diffraction, interference, other process effects and the like. OPC adjusts IC design layout diagram 1322. In some embodiments, mask data preparation 1332 includes further resolution enhancement techniques (RET), such as off-axis illumination, sub-resolution assist features, phase shifting masks, other suitable techniques, and the like or combination thereof. In some embodiments, inverse lithography technology (ILT) is also used, which treats OPC as an inverse imaging problem.

In some embodiments, mask data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during mask fabrication 1344, which may undo part of the modifications performed by OPC in order to meet mask creation rules.

In some embodiments, mask data preparation 1332 includes lithography process checking (LPC) that simulates processing that will be implemented by IC fab 1350 to fabricate IC device 1360. LPC simulates this processing based on IC design layout diagram 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1322.

It should be understood that the above description of mask data preparation 1332 has been simplified for the purposes of clarity. In some embodiments, data preparation 1332 includes additional features such as a logic operation (LOP) to modify the IC design layout diagram 1322 according to manufacturing rules. Additionally, the processes applied to IC design layout diagram 1322 during data preparation 1332 may be executed in a variety of different orders.

After mask data preparation 1332 and during mask fabrication 1344, a mask 1345 or a group of masks 1345 are fabricated based on the modified IC design layout diagram 1322. In some embodiments, mask fabrication 1344 includes performing one or more lithographic exposures based on IC design layout diagram 1322. In some embodiments, an electron-beam (e-beam) or a mechanism of multiple e-beams is used to form a pattern on a mask (photomask or reticle) 1345 based on the modified IC design layout diagram 1322. Mask 1345 can be formed in various technologies. In some embodiments, mask 1345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1345 includes a transparent substrate (e.g., fused quartz) and an opaque material (e.g., chromium) coated in the opaque regions of the binary mask. In another example, mask 1345 is formed using a phase shift technology. In a phase shift mask (PSM) version of mask 1345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in semiconductor wafer 1353, in an etching process to form various etching regions in semiconductor wafer 1353, and/or in other suitable processes.

IC fab 1350 is an IC fabrication business that includes one or more manufacturing facilities for the fabrication of a variety of different IC products. In some embodiments, IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1350 includes fabrication tools 1352 configured to execute various manufacturing operations on semiconductor wafer 1353 such that IC device 1360 is fabricated in accordance with the mask(s), e.g., mask 1345. In various embodiments, fabrication tools 1352 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1350 uses mask(s) 1345 fabricated by mask house 1330 to fabricate IC device 1360. Thus, IC fab 1350 at least indirectly uses IC design layout diagram 1322 to fabricate IC device 1360. In some embodiments, semiconductor wafer 1353 is fabricated by IC fab 1350 using mask(s) 1345 to form IC device 1360. In some embodiments, the IC fabrication includes performing one or more lithographic exposures based at least indirectly on IC design layout diagram 1322. Semiconductor wafer 1353 includes a silicon substrate or other proper substrate having material layers formed thereon. Semiconductor wafer 1353 further includes one or more of various doped regions, dielectric features, multilevel interconnects, and the like (formed at subsequent manufacturing steps).

Details regarding an integrated circuit (IC) manufacturing system (e.g., system 1300 of FIG. 13), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of the present disclosure relates to a method. The method includes fabricating a first-type transistor having a source region in a first semiconductor structure and fabricating a second-type transistor having a source region in a second semiconductor structure. The method includes fabricating a gate-conductor intersecting either the first semiconductor structure or the second semiconductor structure at a channel region. The gate-conductor extends in a second direction that is perpendicular to a first direction. The method includes fabricating a first-voltage underlayer power rail conductively connecting to the source region of the first-type transistor and fabricating a second-voltage underlayer power rail conductively connecting to the source region of the second-type transistor. Each of the first-voltage and second-voltage underlayer power rails extends in the first direction. The method includes depositing an insulating material covering the first-voltage underlayer power rail and the second-voltage underlayer power rail, and depositing a metal over the insulating material to form a first connection layer. The method includes patterning the first connection layer to form a first-voltage power rail extending in the second direction, a second-voltage power rail extending in the second direction, and a first signal conducting line extending in the second direction. The first-voltage power rail is directly connected with the first-voltage underlayer power rail through a first via-connector and the second-voltage power rail is directly connected with the second-voltage underlayer power rail through a second via-connector. The first signal conducting line is directly connected with the gate-conductor through a gate via-connector.

Another aspect of the present disclosure relates to a method. The method includes fabricating a first semiconductor structure extending in a first direction. The method also includes fabricating a first terminal-conductor intersecting the first semiconductor structure. The method also includes fabricating a gate-conductor extending in a second direction and intersecting the first semiconductor structure at a channel region, the second direction being perpendicular to the first direction; fabricating a first-voltage underlayer power rail extending in the first direction which is conductively connected to the first terminal-conductor, depositing an insulating material covering the first-voltage underlayer power rail, fabricating a first via-connector and a gate via-connector each passing through the insulating material. The method also includes depositing a metal over the insulating material to form a first connection layer. The method also includes patterning the first connection layer to form a first-voltage power rail extending in the second direction and a first signal conducting line extending in the second direction, where the first-voltage power rail is directly connected with the first-voltage underlayer power rail through the first via-connector, and where the first signal conducting line is directly connected with the gate-conductor through the gate via-connector.

Still another aspect of the present disclosure relates to a method. The method includes fabricating a first semiconductor structure extending in a first direction. The method also includes fabricating a first terminal-conductor intersecting the first semiconductor structure. The method also includes fabricating a drain terminal-conductor extending in a second direction and intersecting the first semiconductor structure at a drain region, the second direction being perpendicular to the first direction; fabricating a first-voltage underlayer power rail extending in the first direction which is conductively connected to the first terminal-conductor, depositing an insulating material covering the first-voltage underlayer power rail, fabricating a first via-connector and a terminal via-connector each passing through the insulating material. The method also includes depositing a metal over the insulating material to form a first connection layer. The method also includes patterning the first connection layer to form a first-voltage power rail extending in the second direction and a first signal conducting line extending in the second direction, where the first-voltage power rail is directly connected with the first-voltage underlayer power rail through the first via-connector, and where the first signal conducting line is directly connected with the drain terminal-conductor through the terminal via-connector.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method comprising:
   fabricating a first-type transistor having a source region in a first semiconductor structure and fabricating a second-type transistor having a source region in a second semiconductor structure;
   fabricating a gate-conductor intersecting either the first semiconductor structure or the second semiconductor structure at a channel region, the gate-conductor extending in a second direction that is perpendicular to a first direction;
   fabricating a first-voltage underlayer power rail conductively connecting to the source region of the first-type transistor and fabricating a second-voltage underlayer power rail conductively connecting to the source region of the second-type transistor, each of the first-voltage underlayer power rail and second-voltage underlayer power rail extending in the first direction;
   depositing an insulating material covering the first-voltage underlayer power rail and the second-voltage underlayer power rail;
   depositing a metal over the insulating material to form a first connection layer; and
   patterning the first connection layer to form a first-voltage power rail extending in the second direction, a second-voltage power rail extending in the second direction, and a first signal conducting line extending in the second direction, wherein the first-voltage power rail is directly connected with the first-voltage underlayer power rail through a first via-connector and the second-voltage power rail is directly connected with the second-voltage underlayer power rail through a second via-connector, and wherein the first signal conducting line is directly connected with the gate-conductor through a gate via-connector.

2. The method of claim 1, further comprising:
   fabricating a terminal-conductor that intersects the first semiconductor structure at a drain region of the first-type transistor or intersects the second semiconductor structure at a drain region of the second-type transistor; and
   wherein patterning the first connection layer further comprises patterning the first connection layer to form a second signal conducting line extending in the second direction, the second signal conducting line being directly connected with the terminal-conductor through a terminal via-connector.

3. The method of claim 1, further comprising:
   fabricating a first terminal-conductor intersecting the first semiconductor structure at the source region of the first-type transistor, where the first terminal-conductor is conductively connected to the first-voltage underlayer power rail; and
   fabricating a second terminal-conductor intersecting the second semiconductor structure at the source region of the second-type transistor, wherein the second terminal-conductor is conductively connected to the first-voltage underlayer power rail.

4. The method of claim 1, further comprising:
   fabricating the first semiconductor structure and the second semiconductor structure as one of a fin structure, a nano-sheet structure, or a nanowire structure.

5. The method of claim 1, further comprising:
   fabricating the first semiconductor structure having channel regions for p-type transistors; and
   fabricating the second semiconductor structure having channel regions for n-type transistors.

6. The method of claim 1, further comprising:
   fabricating the first semiconductor structure having channel regions for n-type transistors; and
   fabricating the second semiconductor structure having channel regions for p-type transistors.

7. The method of claim 1, further comprising:
   depositing a metal over a layer of inter-layer dielectric that overlies the first connection layer to form a second connection layer; and
   patterning the second connection layer to form a first-voltage power stub conductively connected to the first-voltage power rail and to form a second-voltage power stub conductively connected to the second-voltage power rail.

8. The method of claim 7, further comprising:
   fabricating a plurality of gate-conductors extending in the second direction, each of the gate-conductors intersecting at least one of the first semiconductor structure and the second semiconductor structure, wherein two adjacent gate-conductors are separated along the first direction by a contacted poly pitch ("CPP") distance; and
   wherein a length of the first-voltage power stub or the second-voltage power stub along the first direction is in range from two times the CPP distance to four times the CPP distance.

9. The method of claim 7, further comprising:
   fabricating and making each of the first-voltage power stub and the second-voltage power stub intersecting with a cell boundary that extends in the second direction.

10. A method comprising:
    fabricating a first semiconductor structure extending in a first direction;

fabricating a first terminal-conductor intersecting the first semiconductor structure;

fabricating a gate-conductor extending in a second direction and intersecting the first semiconductor structure at a channel region, the second direction being perpendicular to the first direction;

fabricating a first-voltage underlayer power rail extending in the first direction which is conductively connected to the first terminal-conductor;

depositing an insulating material covering the first-voltage underlayer power rail;

fabricating a first via-connector and a gate via-connector each passing through the insulating material;

depositing a metal over the insulating material to form a first connection layer; and patterning the first connection layer to form a first-voltage power rail extending in the second direction and a first signal conducting line extending in the second direction, wherein the first-voltage power rail is directly connected with the first-voltage underlayer power rail through the first via-connector, and wherein the first signal conducting line is directly connected with the gate-conductor through the gate via-connector.

11. The method of claim 10, further comprising:
fabricating a terminal-conductor that intersects the first semiconductor structure at a drain region; and
wherein patterning the first connection layer further comprises patterning the first connection layer to form a second signal conducting line extending in the second direction, the second signal conducting line being directly connected with the terminal-conductor through a terminal via-connector.

12. The method of claim 10, further comprising:
fabricating a second-type transistor having a source region in a second semiconductor structure;
fabricating a second terminal-conductor intersecting the second semiconductor structure; and
fabricating a second-voltage underlayer power rail extending in the first direction which is conductively connected to the second terminal-conductor.

13. The method of claim 12, further comprising:
fabricating the first semiconductor structure and the second semiconductor structure as one of a fin structure, a nano-sheet structure, or a nanowire structure.

14. The method of claim 10, further comprising:
depositing a metal over a layer of inter-layer dielectric that overlies the first connection layer to form a second connection layer; and
patterning the second connection layer to form a first-voltage power stub conductively connected to the first-voltage power rail.

15. The method of claim 14, further comprising:
fabricating a plurality of gate-conductors extending in the second direction, each of the gate-conductors intersecting the first semiconductor structure, wherein two adjacent gate-conductors are separated along the first direction by a contacted poly pitch ("CPP") distance; and wherein a length of the first-voltage power stub along the first direction is in range from two times the CPP distance to four times the CPP distance.

16. The method of claim 14, further comprising:
fabricating and making the first-voltage power stub intersecting with a cell boundary that extends in the second direction.

17. A method comprising:
fabricating a first semiconductor structure extending in a first direction;

fabricating a first terminal-conductor intersecting the first semiconductor structure;

fabricating a drain terminal-conductor extending in a second direction and intersecting the first semiconductor structure at a drain region, the second direction being perpendicular to the first direction;

fabricating a first-voltage underlayer power rail extending in the first direction which is conductively connected to the first terminal-conductor;

depositing an insulating material covering the first-voltage underlayer power rail;

fabricating a first via-connector and a terminal via-connector each passing through the insulating material;

depositing a metal over the insulating material to form a first connection layer; and patterning the first connection layer to form a first-voltage power rail extending in the second direction and a first signal conducting line extending in the second direction, wherein the first-voltage power rail is directly connected with the first-voltage underlayer power rail through the first via-connector, and wherein the first signal conducting line is directly connected with the drain terminal-conductor through the terminal via-connector.

18. The method of claim 17, further comprising:
fabricating a second-type transistor having a source region in a second semiconductor structure;
fabricating a second terminal-conductor intersecting the second semiconductor structure; and
fabricating a second-voltage underlayer power rail extending in the first direction which is conductively connected to the second terminal-conductor.

19. The method of claim 17, further comprising:
depositing a metal over a layer of inter-layer dielectric that overlies the first connection layer to form a second connection layer; and
patterning the second connection layer to form a first-voltage power stub conductively connected to the first-voltage power rail.

20. The method of claim 19, further comprising:
fabricating and making the first-voltage power stub intersecting with a cell boundary that extends in the second direction.

* * * * *